(12) United States Patent
Mabuchi

(10) Patent No.: US 10,506,144 B2
(45) Date of Patent: *Dec. 10, 2019

(54) CONVERSION APPARATUS, IMAGING APPARATUS, ELECTRONIC APPARATUS, AND CONVERSION METHOD

(71) Applicant: SONY CORPORATION, Tokyo (JP)

(72) Inventor: Keiji Mabuchi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/410,476

(22) Filed: May 13, 2019

(65) Prior Publication Data

US 2019/0335069 A1    Oct. 31, 2019

Related U.S. Application Data

(63) Continuation of application No. 15/867,011, filed on Jan. 10, 2018, now Pat. No. 10,291,829, which is a
(Continued)

(30) Foreign Application Priority Data

Aug. 5, 2013    (JP) .................................. 2013-162209

(51) Int. Cl.
*H04N 5/225*    (2006.01)
*H04N 5/376*    (2011.01)
(Continued)

(52) U.S. Cl.
CPC .......... *H04N 5/2253* (2013.01); *H03M 1/144* (2013.01); *H04N 5/378* (2013.01);
(Continued)

(58) Field of Classification Search
CPC .... H04N 5/2253; H04N 5/378; H04N 5/3765; H04N 5/37457; H03M 1/144;
(Continued)

(56) References Cited

U.S. PATENT DOCUMENTS 8,711,016 B2 *   4/2014   Kim .................... H03K 23/005
                                                            341/98
8,766,843 B2 *   7/2014   Ueno .................. H03M 1/0863
                                                            341/155

(Continued)

*Primary Examiner* — Pritham D Prabhakher
(74) *Attorney, Agent, or Firm* — Sheridan Ross P.C.

(57) ABSTRACT

The present technology relates to a conversion apparatus, an imaging apparatus, an electronic apparatus, and a conversion method that are capable of reducing the scale of a circuit. The conversion apparatus includes: a comparison unit that compares an input voltage of an input signal and a ramp voltage of a ramp signal that varies with time; and a storage unit that holds a code value when a comparison result from the comparison unit is inverted, the holding of the code value by the storage unit being repeated a plurality of times, to generate a digital signal having a predetermined bit number. The predetermined bit number is divided into high-order bits and low-order bits, the low-order bits are acquired earlier than the high-order bits, and the acquired low-order bits and the high-order bits are combined with each other, to generate the digital signal having the predetermined bit number. The present technology can be applied to a portion of an image sensor, in which AD conversion is performed.

10 Claims, 20 Drawing Sheets

Related U.S. Application Data continuation of application No. 14/908,290, filed as application No. PCT/JP2014/069277 on Jul. 22, 2014, now Pat. No. 9,924,080.

(51) Int. Cl.

| | | |
|---|---|---|
| *H04N 5/3745* | (2011.01) | |
| *H04N 5/378* | (2011.01) | |
| *H03M 1/14* | (2006.01) | |
| *H03M 1/56* | (2006.01) | |
| *H03M 1/12* | (2006.01) | |

(52) U.S. Cl.
CPC ....... *H04N 5/3765* (2013.01); *H04N 5/37457* (2013.01); *H03M 1/123* (2013.01); *H03M 1/56* (2013.01)

(58) Field of Classification Search
CPC ...... H03M 1/56; H03M 1/123; H03M 1/0678; H03M 1/34; H03M 1/12; H03M 1/1023; H03M 1/36; H03M 1/002; H03M 1/0872; H03M 7/16; H01L 27/146
See application file for complete search history.

(56) References Cited

U.S. PATENT DOCUMENTS

| | | | |
|---|---|---|---|
| 8,767,107 B2* | 7/2014 | Teshima | H04N 5/365 348/300 |
| 8,933,544 B2* | 1/2015 | Mao | H01L 27/14623 257/622 |
| 9,406,711 B2* | 8/2016 | Chen | H01L 27/14636 |
| 9,412,725 B2* | 8/2016 | Chen | H01L 25/16 |
| 2012/0241961 A1* | 9/2012 | Kagawa | H01L 24/80 257/758 |
| 2013/0009321 A1* | 1/2013 | Kagawa | H01L 21/76807 257/774 |
| 2013/0068929 A1* | 3/2013 | Solhusvik | H01L 27/14634 250/208.1 |
| 2013/0107091 A1* | 5/2013 | Teshima | H04N 5/365 348/300 |
| 2013/0215302 A1* | 8/2013 | Ueno | H03M 1/0863 348/300 |
| 2013/0215303 A1* | 8/2013 | Ueno | H03K 5/08 348/300 |
| 2013/0278451 A1* | 10/2013 | Kim | H03K 23/005 341/98 |
| 2013/0334638 A1* | 12/2013 | Chen | H01L 27/14634 257/432 |

\* cited by examiner

CONVERSION APPARATUS, IMAGING APPARATUS, ELECTRONIC APPARATUS, AND CONVERSION METHOD

CROSS REFERENCE TO RELATED APPLICATIONS

This application is a continuation of U.S. patent application Ser. No. 15/867,011, filed Jan. 10, 2018, which is a continuation of U.S. patent application Ser. No. 14/908,290, filed Jan. 28, 2016, now U.S. Pat. No. 9,924,080, which is a national stage application under 35 U.S.C. 371 and claims the benefit of PCT Application No. PCT/JP2014/069277 having an international filing date of Jul. 22, 2014, which designated the United States, which PCT application claimed the benefit of Japanese Patent Application No. 2013-162209 filed Aug. 5, 2013, the disclosures of which are incorporated herein by reference in their entirety.

TECHNICAL FIELD

The present technology relates to a conversion apparatus, an imaging apparatus, an electronic apparatus, and a conversion method. More specifically, the present technology relates to a conversion apparatus, an imaging apparatus, an electronic apparatus, and a conversion method that are suitable for downsizing.

BACKGROUND ART

In recent imaging apparatuses, increases in number of pixels, image quality, and speed have been demanded, whereas further downsizing has also been demanded. As an imaging apparatus that satisfies such demands, a laminated-type imaging apparatus is proposed (see, for example, Patent Document 1).

The laminated-type imaging apparatus has a structure in which a chip including a signal processing circuit formed thereon is used instead of a support substrate of the imaging apparatus, and a pixel potion is superimposed thereon. With such a configuration, the downsizing of the imaging apparatus is proposed.

Patent Document 1: Japanese Patent Application Laid-open No. 2009-17720

SUMMARY OF INVENTION

Problem to be Solved by the Invention

In the laminated-type imaging apparatus, when pixels are miniaturized, a circuit mounted on a chip on a lower die is also required to be made small. Examples of the circuit mounted on the chip include an analog-digital (AD) conversion circuit. The AD conversion circuit includes many transistors and is difficult to be downsized, and thus sharing one AD conversion circuit by a plurality of pixels is proposed.

In a configuration in which a plurality of pixels shares one AD conversion circuit, however, since control of reading signals from the plurality of pixels while switching the signals is performed, when one AD conversion circuit handles many pixels, time differences between the read pixels become large. So, in the case where a moving object is imaged, it is thought that the object may be imaged in a distorted way or long time may be required to read one image.

In view of such cases, there is also a demand for downsizing of the AD conversion circuit mounted on the chip on the lower side, along with the downsizing of the pixels. Further, there is also a demand for the reduced number of pixels handled by the AD conversion circuit.

The present technology has been made in view of the circumstances as described above, and is provided to achieve downsizing of a circuit configuration related to the generation of a digital signal having a predetermined bit number.

Means for Solving the Problem

According to one aspect of the present technology, there is provided a conversion apparatus including: a comparison unit that compares an input voltage of an input signal and a ramp voltage of a ramp signal that varies with time; and a storage unit that holds a code value when a comparison result from the comparison unit is inverted, the holding of the code value by the storage unit being repeated a plurality of times, to generate a digital signal having a predetermined bit number.

The predetermined bit number may be divided into high-order bits and low-order bits, the low-order bits may be acquired earlier than the high-order bits, and the acquired low-order bits and the high-order bits may be combined with each other, to generate the digital signal having the predetermined bit number.

The low-order bits may be Gray codes.

At least one bit of the low-order bits and the high-order bits may be shared.

The digital signal may be corrected by a value of a bit that is one-order lower than the shared bit.

The ramp signal for acquiring the low-order bits and the ramp signal for acquiring the high-order bits may have different cycles.

The input signal may be a signal output from a pixel and provided by each pixel.

According to one aspect of the present technology, there is provided an imaging apparatus including: an upper substrate and a lower substrate that are laminated on each other, the upper substrate including thereon pixels and a comparison unit that compares a voltage of a signal from the pixels and a ramp voltage of a ramp signal that varies with time, the lower substrate including thereon a storage unit that holds a code value when a comparison result from the comparison unit is inverted, the holding of the code value by the storage unit being repeated a plurality of times, to generate a digital signal having a predetermined bit number.

The predetermined bit number may be divided into high-order bits and low-order bits, and the low-order bits may be acquired earlier than the high-order bits, a signal of a reference level and a signal of a signal level may be acquired in an order of low-order bits of the reference level of the pixels, high-order bits of the reference level of the pixels, low-order bits of the signal level of the pixels, and high-order bits of the signal level of the pixels, and one of the signals may be subtracted from the other signal, to generate a digital signal representing a charge amount accumulated in the pixels.

The ramp voltage when the signal of the reference level is acquired and the ramp voltage when the signal level is acquired may be different from each other.

A change in voltage of the ramp signal when a signal on a high-intensity side of the signal level is acquired may be sharper than a change in voltage of the ramp signal when a signal on a low-intensity side is acquired, or a speed at which the code value is supplied to the storage unit when the signal on the high-intensity side of the signal level is acquired may be slower than a speed at which the code value is supplied to the storage unit when the signal on the low-intensity side is acquired.

The signal on the high-intensity side may be corrected based on a difference between a signal acquired at a time point at which the change in voltage of the ramp signal is made sharp or a time point at which the speed for supply of the code value is changed, and the reference level.

According to an aspect of the present technology, there is provided an electronic apparatus including: an imaging apparatus including an upper substrate and a lower substrate, the upper substrate including thereon pixels and a comparison unit that compares a voltage of a signal from the pixels and a ramp voltage of a ramp signal that varies with time, the lower substrate including thereon a storage unit that holds a code value when a comparison result from the comparison unit is inverted, the holding of the code value by the storage unit being repeated a plurality of times, to generate a digital signal having a predetermined bit number; and a signal processing unit that performs signal processing on an image signal output from the semiconductor apparatus.

According to an aspect of the present technology, there is provided a conversion method for a conversion apparatus including a comparison unit that compares an input voltage of an input signal and a ramp voltage of a ramp signal that varies with time, and a storage unit that holds a code value when a comparison result from the comparison unit is inverted, the conversion method including generating a digital signal having a predetermined bit number by repeating the holding of the code value by the storage unit a plurality of times.

In the conversion apparatus and the conversion method according to one aspect of the present technology, an input voltage of an input signal and a ramp voltage of a ramp signal that varies with time are compared with each other, and a code value when a comparison result is inverted is held. The processing related to the holding is repeated a plurality of times, and thus a digital signal having a predetermined bit number is generated.

In the imaging apparatus according to one aspect of the present technology, the upper substrate and the lower substrate are laminated on each other, the upper substrate including thereon pixels and a comparison unit that compares a voltage of a signal from the pixels and a ramp voltage of a ramp signal that varies with time, the lower substrate including thereon a storage unit that holds a code value when a comparison result from the comparison unit is inverted. The holding of the code value by the storage unit is repeated a plurality of times, and thus a digital signal having a predetermined bit number is generated.

In the electronic apparatus according to one aspect of the present technology, a configuration including the imaging apparatus is provided.

Effects of the Invention

According to one aspect of the present technology, a circuit configuration related to the generation of a digital signal having a predetermined bit number can be downsized.

It should be noted that the effects described herein are not necessarily limited and any of the effects described herein may be produced.

DETAILED DESCRIPTION

Hereinafter, modes for carrying out the present technology (hereinafter, called embodiments) will be described. It should be noted that the description is given in the following order.

1. Configuration of Laminated-Type Imaging apparatus
2. Embodiment of Circuit Layout in Each Layer
3. Another Embodiment of Circuit Layout in Each Layer
4. Configuration with Reduced Number of Latches
5. Electronic Apparatus
6. Recording Medium <Configuration of Laminated-Type Imaging Apparatus>

Figure 1:
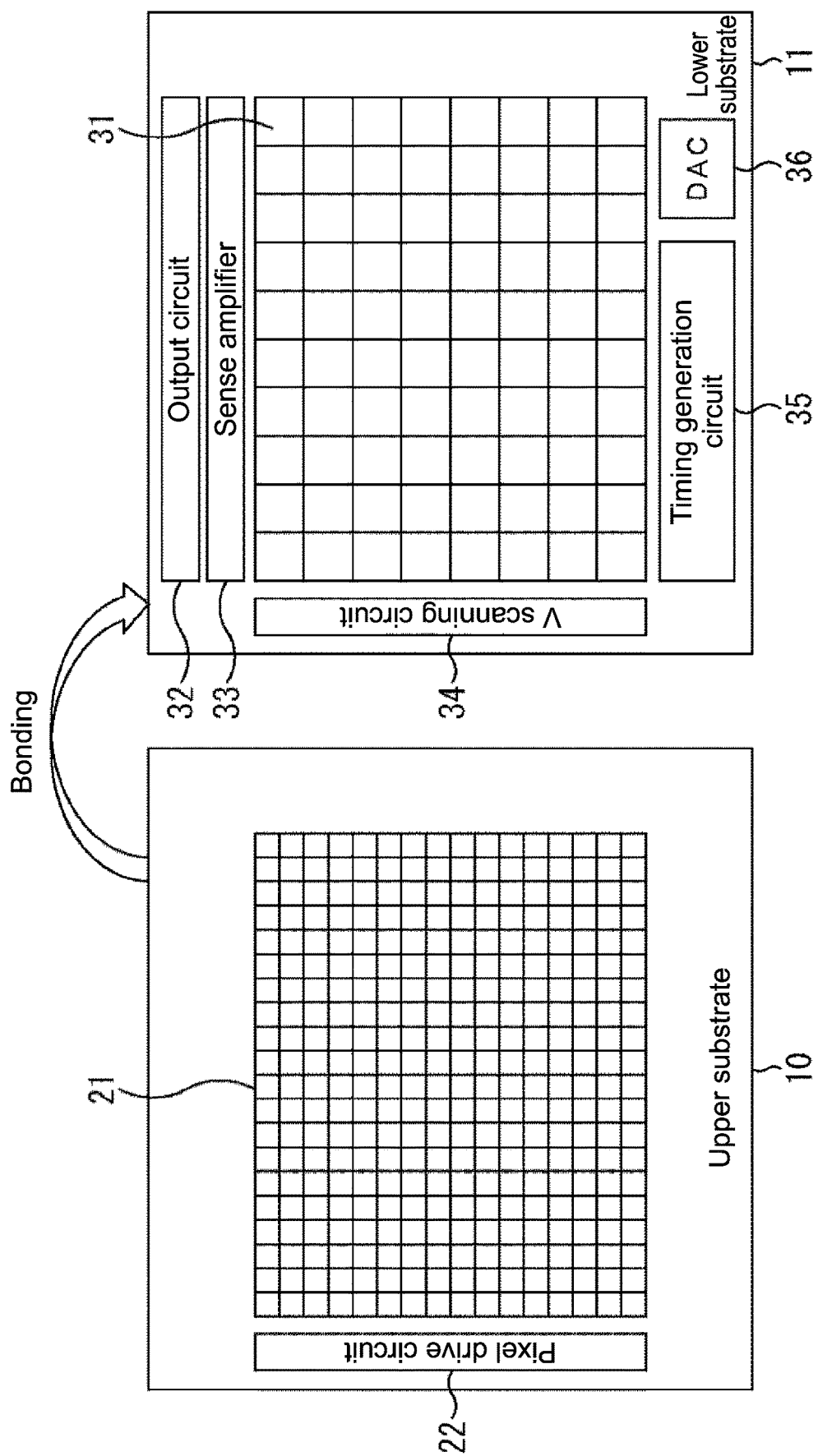
FIG. 1 is a diagram for describing a configuration of an imaging device.

FIG. 1 is a diagram showing a configuration of an imaging apparatus to which the present technology is applied. The present technology can be applied to a laminated-type imaging apparatus. The laminated-type imaging apparatus has a structure in which a chip including a signal processing circuit formed thereon is used instead of a support substrate for a pixel portion, and the pixel potion is superimposed thereon. Such a configuration enables downsizing of the imaging apparatus.

As shown in FIG. 1, on an upper substrate 10, pixels 21 are disposed in a matrix, and a pixel drive circuit 22 for driving the pixels 21 is disposed. On a lower substrate 11, ADCs (A/D Converters) 31 are disposed in a matrix at positions corresponding to the respective pixels 21. The example of FIG. 1 shows a configuration in which four (2×2) pixels are assumed as one block and one ADC 31 processes the four pixels 21 of one block. In such a configuration, the ADCs 31 are operated in parallel, and each ADC 31 performs AD conversion while scanning the four pixels.

The lower substrate 11 is equipped with an output circuit 32, a sense amplifier 33, a V scanning circuit 34, a timing generation circuit 35, and a DAC (D/A Converter) as well. The output from the ADC 31 is output to the outside via the sense amplifier 33 and the output circuit 32. Processing involving reading from the pixels 21 is performed by the pixel drive circuit 22 and the V scanning circuit 34 and controlled at a timing generated by the timing generation circuit 35. Further, the DAC 36 is a circuit to generate a ramp signal.

Figure 2:
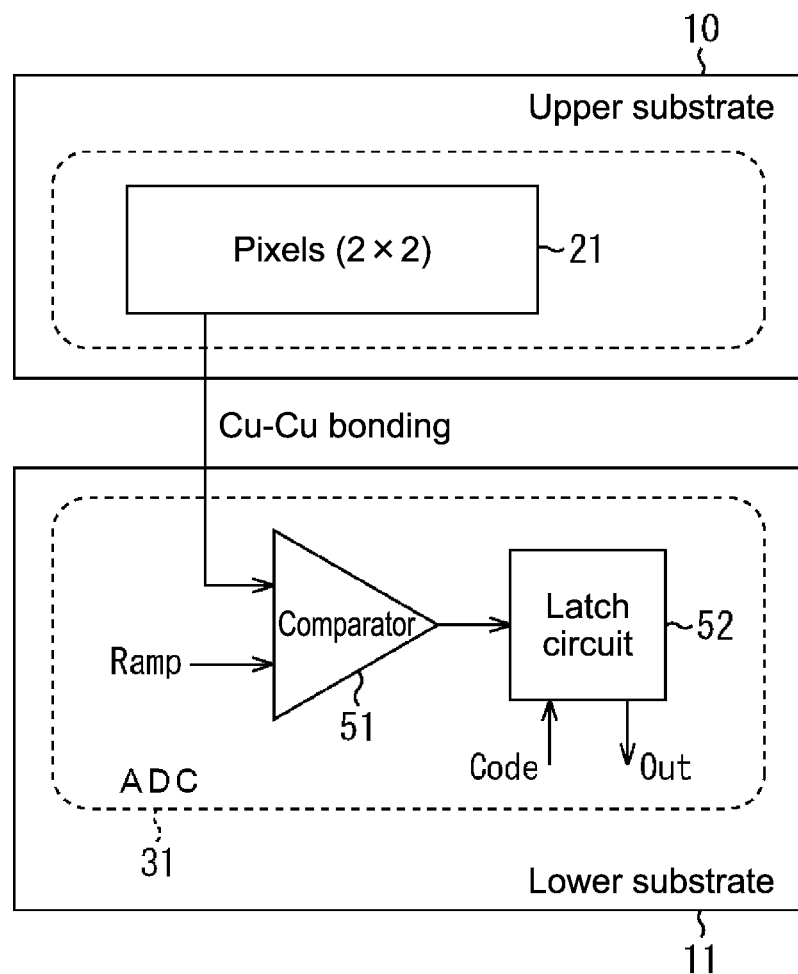
FIG. 2 is a diagram for describing circuits disposed on an upper substrate and a lower substrate.

The ramp signal is a signal supplied to a comparator of the ADC 31. With reference to FIG. 2, the internal configuration of the ADC 31 will be described. FIG. 2 is a block diagram showing a configuration of the pixels 21 of one bock and the ADC 31. A signal from the pixels 21 of one block, which are constituted by four (2×2) pixels, is compared with a ramp voltage of the ramp signal in a comparator 51 of the ADC 31.

The ramp voltage is a voltage gradually reduced from a predetermined voltage and is configured such that when the drop of the ramp voltage starts and the signal from the pixels 21 passes across (when the voltage of the signal from the pixels 21 and the ramp voltage become identical), the output of the comparator 51 is inverted. The output of the comparator 51 is input to a latch circuit 52. The latch circuit 52 has a configuration in which a code value indicating a time of that moment is input thereto, and the code value when the output of the comparator 51 is inverted is held and then read.

Figure 3:
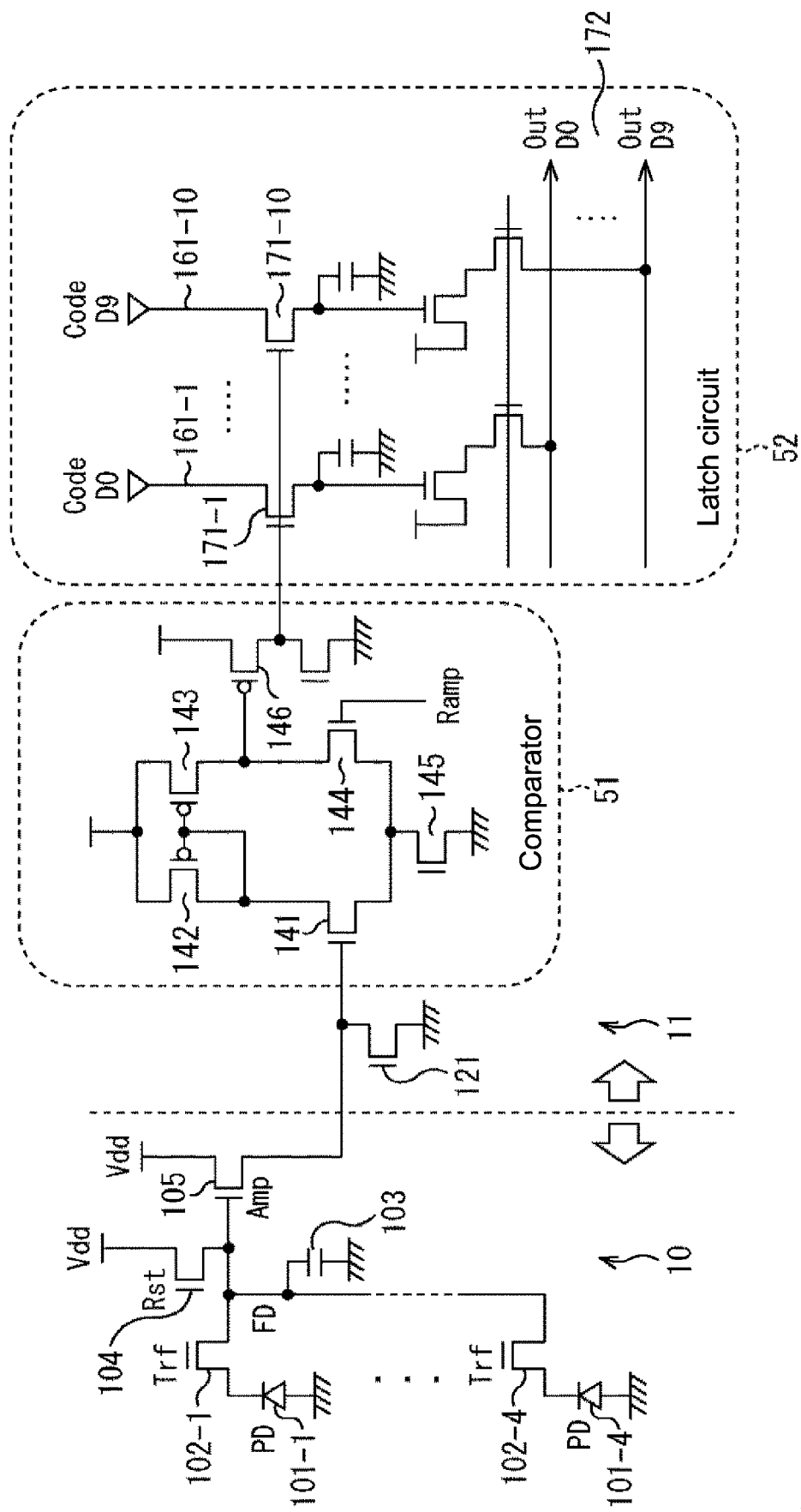
FIG. 3 is a diagram showing a circuit configuration of the imaging device.

FIG. 3 shows a circuit diagram of the imaging apparatus including the ADC 31. In FIG. 3, circuits included in the upper substrate 10 and the lower substrate 11 shown in FIG. 1 are shown. The upper substrate 10 includes the pixels 21, and the circuit thereof has a configuration as shown in the left part of FIG. 3. Here, a configuration in which one FD (floating diffusion) is shared by four pixels will be described as an example.

Photodiodes (PD) 101-1 to 101-4 as photoelectric conversion units are connected to transfer transistors (Trf) 102-1 to 102-4, respectively. Hereinafter, in the case where the photodiodes 101-1 to 101-4 do not need to be distinguished from one another, the photodiodes 101-1 to 101-4 are simply described as photodiode(s) 101. The same holds true for other portions.

The transfer transistors 102-1 to 102-4 are each connected to a floating diffusion (FD) 103. The transfer transistor 102 transfers signal charge accumulated by photoelectric conversion in the photodiode 101 to the floating diffusion 103 at a timing at which a transfer pulse is provided.

The floating diffusion 103 functions as a charge-voltage conversion unit that converts the signal charge to a voltage signal. In a reset transistor (Rst) 104, a drain electrode is connected to a pixel power supply of a power supply voltage Vdd, and a source electrode is connected to the floating diffusion 103. Before the signal charge is transferred from the photodiode 101 to the floating diffusion 103, the reset transistor 104 provides a reset pulse RST to a gate electrode and resets the voltage of the floating diffusion 103 to a reset voltage.

In an amplifier transistor (Amp) 105, a gate electrode is connected to the floating diffusion 103, and a drain electrode is connected to a pixel power supply of a power supply voltage Vdd. The voltage of the floating diffusion 103 after being reset by the reset transistor 104 is output as a reset level, and the voltage of the floating diffusion 103 after the signal charge is transferred by the transfer transistor 102 is further output as a signal level.

The amplifier transistor 105 and a load MOS 121 provided in the lower substrate 11 are paired to operate as a source follower and transfer an analog signal representing the voltage of the floating diffusion 103 to the comparator 51 of the lower substrate 11.

The comparator 51 can be constituted by a differential amplifier circuit. The comparator 51 includes a differential transistor pair unit, a load transistor pair unit, and a current source unit 145. The differential transistor pair unit includes transistors 141 and 144. The load transistor pair unit is provided on the power supply side and includes transistors 142 and 143 serving as an output load of the differential transistor pair unit. The current source unit 145 is provided on the ground (GND) side and supplies a constant operating current.

Sources of the transistors 141 and 144 are each connected to a drain of a transistor of the current source unit 145 commonly, and the drains (output terminals) of the transistors 141 and 144 are connected to drains of the corresponding transistors 142 and 143 of the load transistor pair unit.

The output of the differential transistor pair unit (in the example shown in the figure, the drain of the transistor 144) is sufficiently amplified through a buffer 146 and then output to the latch circuit 52.

An image signal transferred from the pixels 21 is supplied to a gate (input terminal) of the transistor 141, and a ramp signal is supplied from the DAC 36 to a gate (input terminal) of the transistor 144.

The latch circuit 52 is constituted by ten latch columns 161-1 to 161-10. Codes D0 to D9 (hereinafter, described as code value D) are input to the latch columns 161-1 to 161-10, respectively. The code values D0 to D9 are code values each indicating a time of that moment.

Each latch column 161 is a dynamic circuit in order to achieve downsizing. Further, the output from the comparator 51 is input to a gate of a transistor 171 that turns each latch column 161 on and off. In such a latch circuit 52, a code value when the output of the comparator 51 is inverted is held, read, and then output to the sense amplifier 33 (FIG. 1).

In such a configuration, the pixels 21 are disposed on the upper substrate 10, and the circuits are disposed on the lower substrate 11. The upper substrate 10 and the lower substrate 11 can be bonded to each other by Cu—Cu bonding, for example. For the Cu—Cu bonding, the technology disclosed in Japanese Patent Application Laid-open No. 2011-54637 previously filed by the applicant can be used.

The upper substrate 10 and the lower substrate 11 are laminated on each other. Thus, it is desirable that the substrates have a basically similar size. In other words, when any of the substrates is larger, the size thereof is the limit in size of the imaging apparatus constituted by the upper substrate 10 and the lower substrate 11.

The pixels 21 disposed on the upper substrate 10 have a small number of transistors and are easily downsized. For example, the ADC 31 of the lower substrate 11 has more transistors and is difficult to be downsized. If the ADCs 31 as many as the pixels 21 disposed on the upper substrate 10 are disposed on the lower substrate 11, there is a high possibility that the lower substrate 11 has a larger size than the upper substrate 10. In this regard, it is conceived that the plurality of pixels 21 shares one ADC 31. FIG. 1 shows a case where four pixels share one ADC 31.

In the configuration in which the plurality of pixels shares one ADC 31, since control of reading signals from the plurality of pixels 21 (in this case, four pixels) while switching the signals is performed, when one ADC 31 handles many pixels, time differences between the read pixels become large. So, in the case where a moving object is imaged, for example, it is thought that the object may be imaged in a distorted way or long time may be required to read one image.

In view of such cases, there is a demand for downsizing of the ADC 31 of a chip to be laminated (in this case, the lower substrate 11), along with the downsizing of the pixels 21. Further, there is also a demand for the reduced number of pixels handled by the ADC 31 when the chip is downsized.

Further, with reference to FIG. 3, the comparator 51 and the load MOS 121 are analog circuits and the performance thereof may vary. This makes it difficult to reduce the size of the transistors and reduce a voltage. The latch circuit 52 is a digital circuit, and thus downsizing and reduction in voltage are relatively easy to perform.

When such small-scale digital circuit and analog circuits are disposed in a large quantity in close proximity to one another, this makes it difficult to optimize a power supply voltage or a withstand voltage of the transistors. Further, since the pixels 21 and the comparator 51 require a steady current, power consumption is difficult to reduce. Further, since the pixels 21 perform output while passing a current, thermal noise is generated.

As described above, merely disposing the pixels 21 on the upper substrate 10 and the circuits on the lower substrate 11 may cause the problems described above.

<Embodiment of Circuit Layout in Each Layer>

Figure 4:
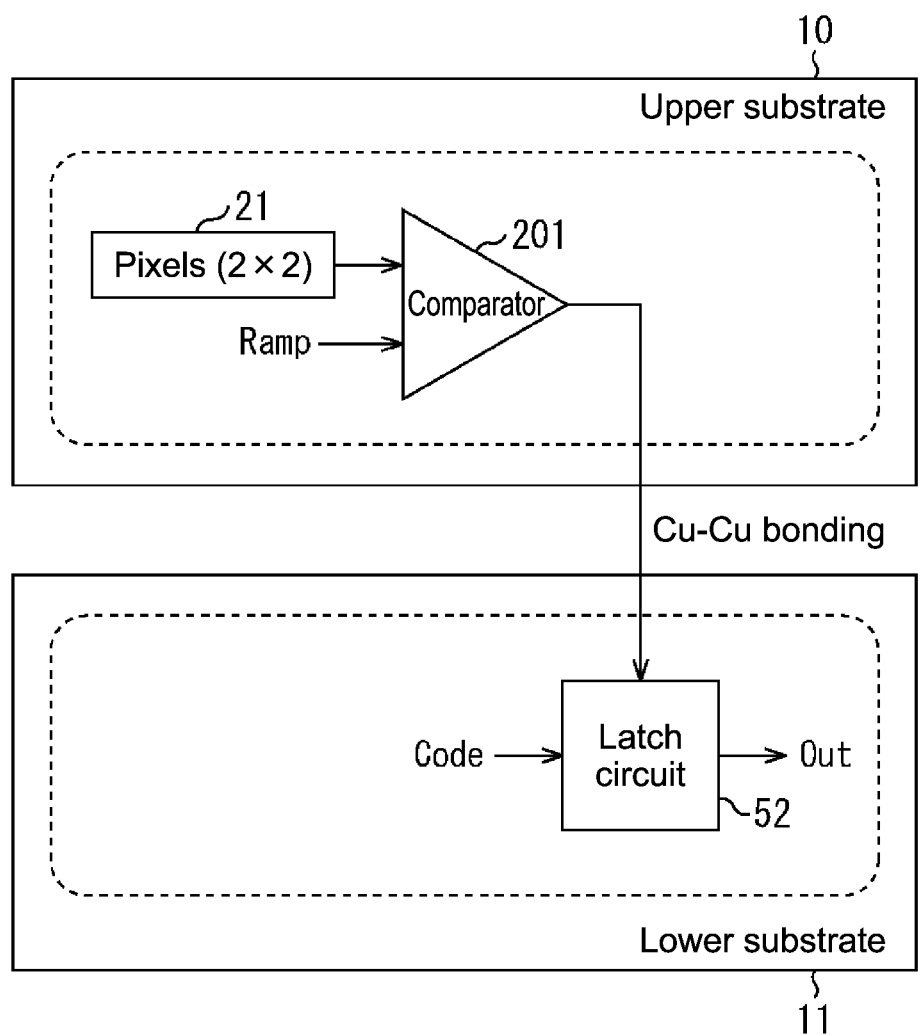
FIG. 4 is a diagram for describing circuits disposed on the upper substrate and the lower substrate.

In this regard, a configuration as shown in FIG. 4 is provided. The configuration shown in FIG. 4 corresponds to the configuration shown in FIG. 2. FIG. 4 is a block diagram showing a configuration of the pixels 21 of one block and the ADC 31. In the configuration shown in FIG. 4, a comparator and a latch circuit that constitute the ADC 31 are disposed separately on the upper substrate 10 and the lower substrate 11, respectively.

To distinguish from the case shown in FIG. 2, the comparator disposed on the upper substrate 10 is denoted by a different reference numeral as a comparator 201 for description. As will be described later, the latch circuit 52 can have a similar configuration to that of the latch circuit 52 described with reference to FIGS. 2 and 3, and thus the latch circuit 52 will be described without changing the reference numeral.

With reference to FIG. 4, the pixels 21 and the comparator 201 are disposed on the upper substrate 10 to have a configuration in which a signal from the pixels 21 and a ramp signal are compared with each other. A comparison result from the comparator 201 is supplied to the latch circuit 52 disposed on the lower substrate 11. The latch circuit 52 is provided with a code representing time information, and converts the signal from the pixels 21 into a digital signal for output to a subsequent stage.

Parts that constitute the whole of the comparator 201 may be disposed on the upper substrate 10, or a main part of the comparator 201 may be disposed thereon. The rest of the ADC 31 disposed on the upper substrate 10 is disposed on the lower substrate 11.

In such a manner, the pixels 21 and the comparator 201 are disposed on the upper substrate 10 and the latch circuit 52 is disposed on the lower substrate 11. In such a manner, in the imaging apparatus shown in FIG. 4, the pixels 21 and the ADC 31 are not disposed on the upper substrate 10 and the lower substrate 11, respectively, in the units of the pixels 21 and the ADC 31 as shown in FIG. 2, but the ADC 31 is divided to be disposed on the upper substrate 10 and the lower substrate 11.

Figure 5:
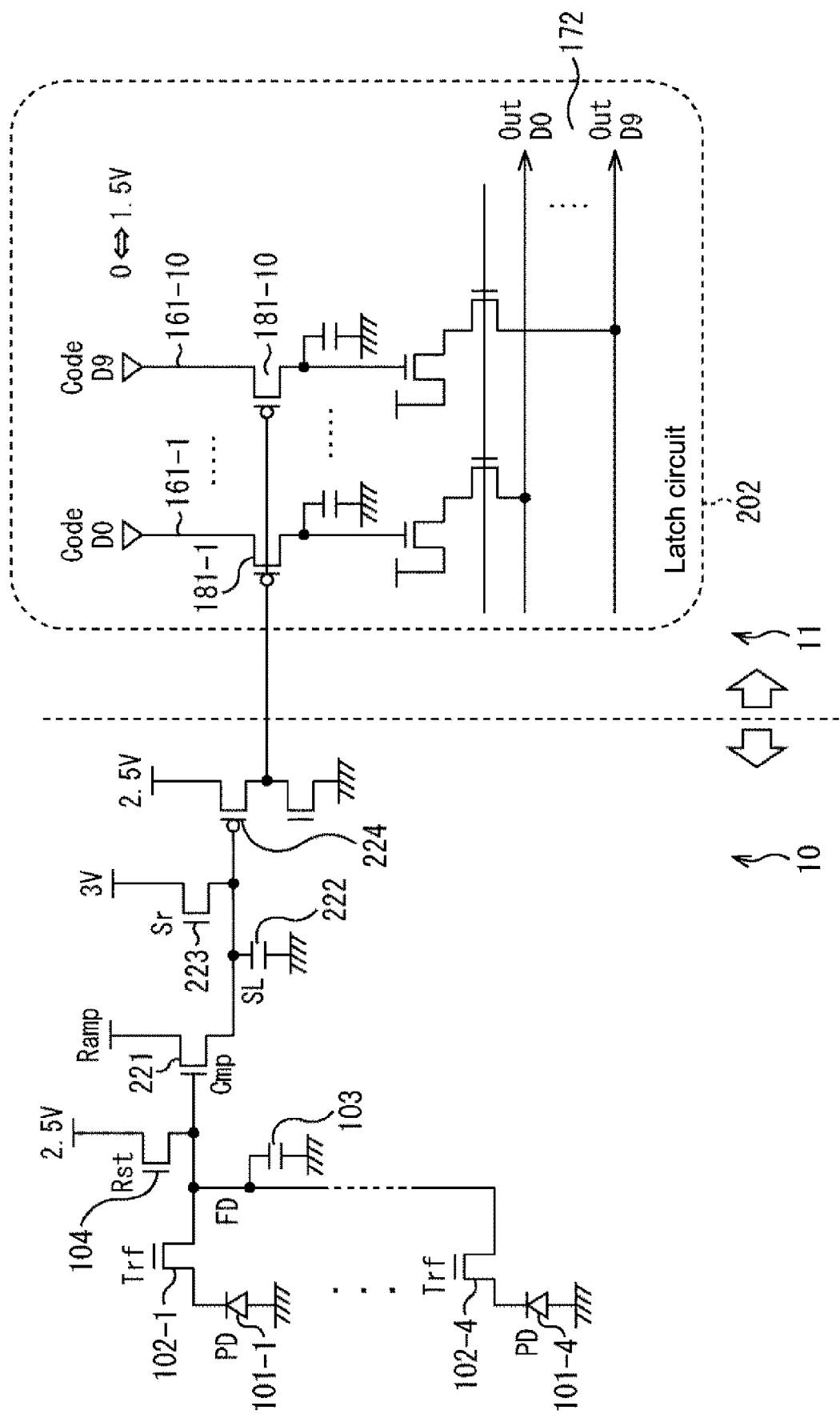
FIG. 5 is a diagram showing a circuit configuration of the imaging device.

FIG. 5 shows a circuit configuration example of the imaging apparatus corresponding to FIG. 4. In the circuit configuration example shown in FIG. 5, the same portions as those of the circuit configuration example shown in FIG. 3 are denoted by the same reference symbols and description thereof will be omitted. As described above, the configuration of the pixels 21 and the latch circuit 52 is the same as the circuit configuration shown in FIG. 3, and a circuit portion corresponding to the comparator 201 is different.

In the circuit configuration shown in FIG. 3, the voltage signal of the floating diffusion 103 is supplied to the amplifier transistor 105, whereas in the circuit configuration shown in FIG. 5, the voltage signal of the floating diffusion 103 is supplied to a comparison transistor (Cmp) 221.

Specifically, in the circuit configuration shown in FIG. 5, the floating diffusion 103 is connected to a gate of the comparison transistor (Cmp) 221. The comparison transistor 221 performs not a source follower operation but an operation of comparing voltage values. One main electrode of the comparison transistor 221 is connected to not a power supply voltage but wiring of a ramp signal, and the other main electrode is connected to a gate of a buffer 224 through a signal line (SL).

An SL 222 includes a parasitic capacitance and, depending on the configuration, a capacitive element. Description will be continued assuming that an Sr 223 is a transistor that resets the SL 222 to have a predetermined voltage, for example, 3 V in this case. The output from the buffer 224 is supplied to the latch circuit 52 of the lower substrate 11 bonded by Cu—Cu bonding, for example.

On the lower substrate 11 side, the latch circuit 52 including the latch columns 161-1 to 161-10 is disposed. The output from the buffer 224 is input to a gate of a transistor 181 that turns the latch circuit 52 on and off. The configuration of a latch circuit 202 is similar to the configuration of the latch circuit 52 shown in FIG. 3 and performs similar processing, but is different in that the transistor 181 is constituted by a PMOS (Positive channel Metal Oxide Semiconductor).

As described above, in the circuit configuration shown in FIG. 5, the configuration of the comparator 51 is simplified as compared to the circuit configuration shown in FIG. 3, and has a configuration in which the load MOS 121 is omitted. The comparator 51 and load MOS 121 shown in FIG. 3 are analog circuits and the performance thereof may vary. This makes it difficult to reduce the size of the transistors and reduce a voltage.

However, since the comparator 51 shown in FIG. 5 is constituted by the comparison transistor 221 without using the differential amplifier circuit, the configuration thereof is simplified. Further, in the circuit configuration shown in FIG. 5, the load MOS 121 is removed. Such a configuration enables the reduction in number of transistors and the downsizing of the configuration of the comparator 201.

Here, in the circuit configuration shown in FIG. 5, a mechanism to convert the voltage of the floating diffusion 103 to be digital will be described.

First, pulses are input to the Sr 223, and the SL 222 is reset to have 3 V. With this, the buffer 224 performs output at a low level (0 V). Since the output from the buffer 224 is low, the PMOS's (transistors 181) of the latch columns 161 are turned on, and code values D0 to D9 each indicating a time pass through the capacitive elements of the latch columns 161.

Figure 6:
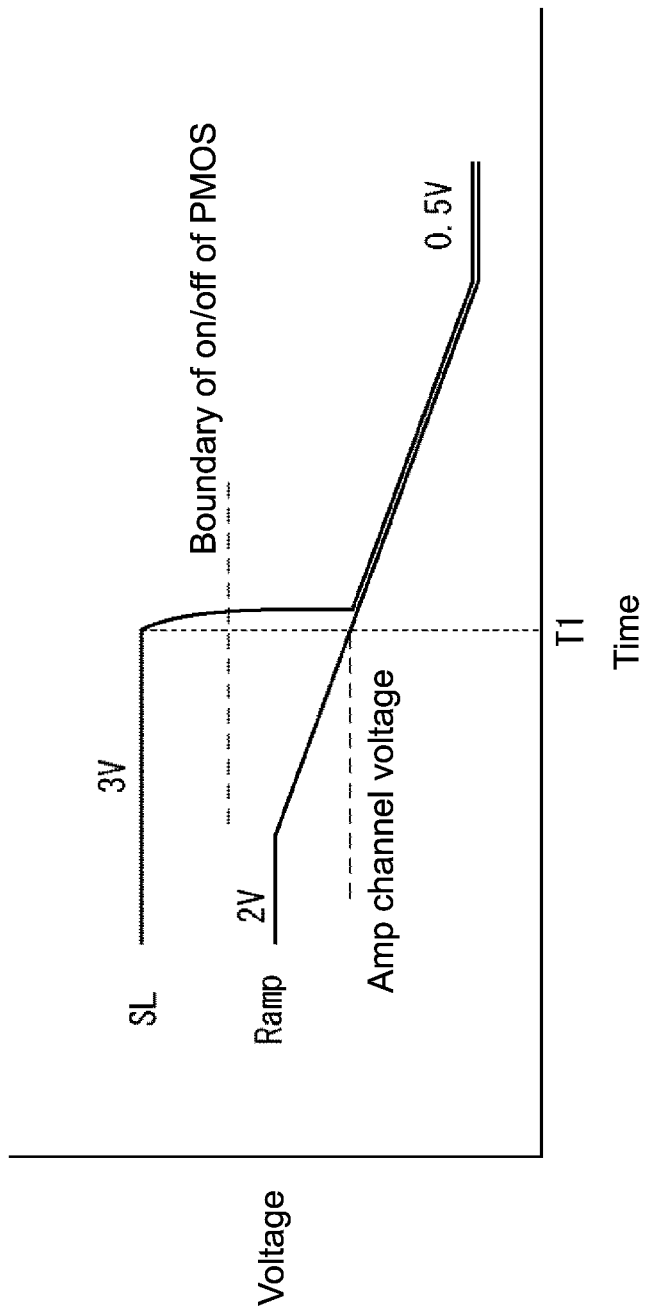
FIG. 6 is a diagram for describing a timing at which a comparison transistor is inverted.

Here, changes in ramp voltage when the ramp voltage is gradually reduced from 2 V and in SL signal of the SL 222 are shown in FIG. 6. When the ramp voltage (in the figure, solid line denoted as Ramp) passes across a channel voltage (in the figure, dotted line denoted as Amp channel voltage) from the comparison transistor 221 (time T1), the comparison transistor 221 is electrically connected.

When the comparison transistor 221 is electrically connected, the voltage of the SL 222 (in the figure, solid line denoted as SL) is reduced to be equal to the ramp voltage at once. As a result, the boundary of on/off of the PMOS of the buffer 224 is exceeded and the buffer 224 is inverted to be a high level.

The PMOS's (transistors 181) of the latch columns 161 are then turned off, a latch capacitance is separated from the code signal, and values at that time point (values of the codes D0 to D9) are held. With such processing, the voltage of the floating diffusion 103 is digitized.

Figure 7:
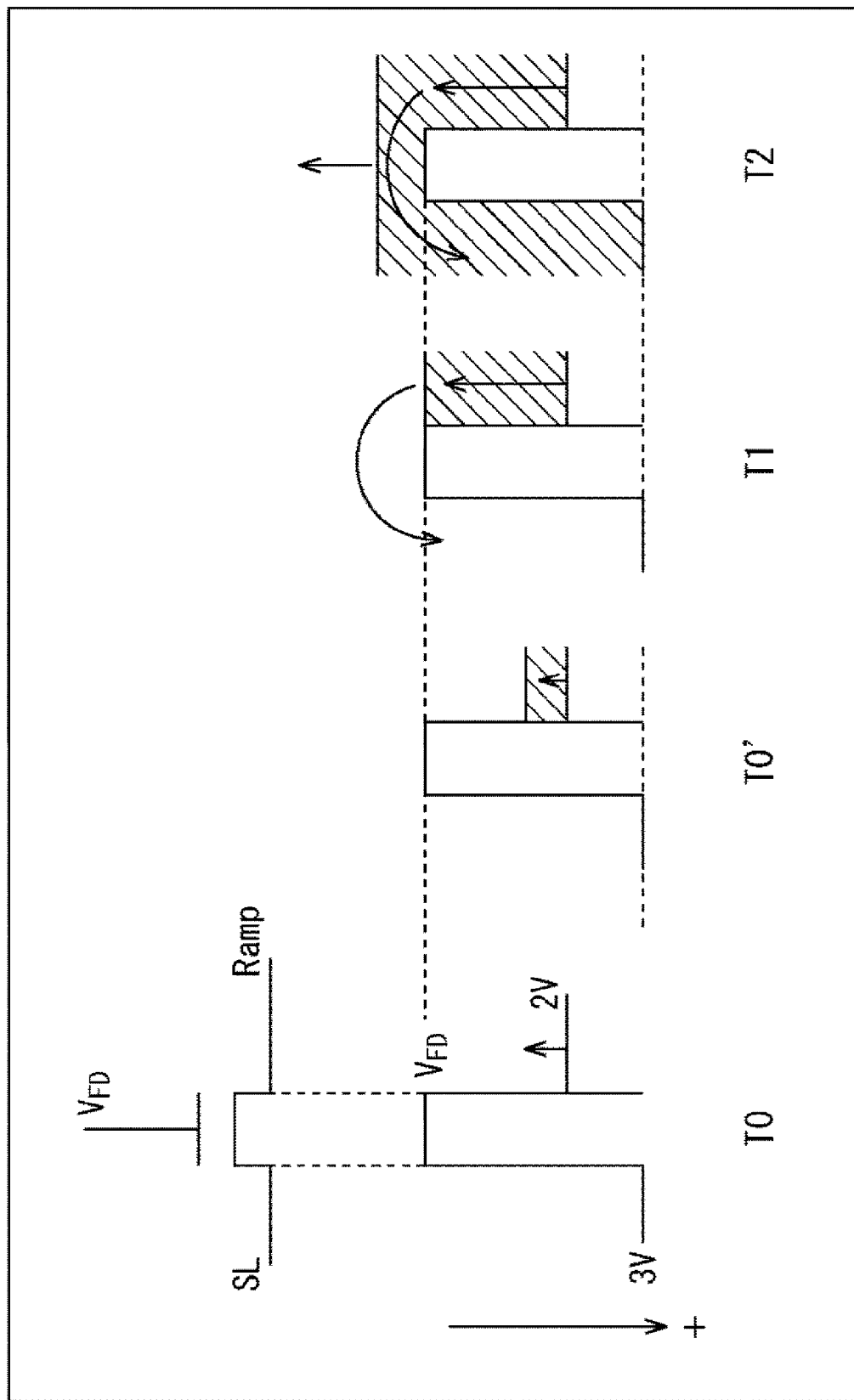
FIG. 7 is a diagram for describing a timing at which the comparison transistor is inverted.

With reference to FIG. 7, the changes in ramp voltage and SL signal of the SL 222 will be described again. The upper diagram of FIG. 7 is the comparison transistor 221 (Cmp 221) and the lower diagram thereof shows a potential. The ramp voltage at time T0 is 2 V, and the voltage of the SL 222 is 3 V. In FIG. 7, a downward direction is a positive direction. Further, the Amp channel voltage is denoted as VFD in FIG. 7.

The voltage of the ramp voltage is gradually reduced from time T0. time T0' is a time that satisfies the following expression.

time T0<time T0'<time T1

At time T0', the ramp voltage is still larger than the channel voltage (VFD) from the comparison transistor 221 (the potential state is lower in the state shown in FIG. 7). Thus, the voltage of the SL 222 remains 3 V.

At time T1, the ramp voltage and the Amp channel voltage (VFD) have the same voltage (in the same potential state). After time T1, the potential of the ramp voltage is higher than the potential of the Amp channel voltage (VFD), and thus electrons flow in the SL 222 side at once. After that, as shown as time T2, the potential of the ramp voltage and the potential of the SL 222 rise in the same proportion. In other words, the voltage of the SL 222 drops as in the ramp voltage.

The potentials change as described above, and thus the voltage relationship is as shown in FIG. 6. In the comparison transistor 221, a timing at which the ramp voltage and the Amp channel voltage become almost the same can be detected. When the ramp voltage and the Amp channel voltage become almost the same, as described above, the comparison transistor 221 is electrically connected, and the boundary of on/off of the PMOS of the buffer 224 is exceeded and the buffer 224 is inverted to be a high level.

Such an operation is performed in all the ADCs 31 at the same time, and then latched signals are sequentially read by the sense amplifier 33 on a row by row basis. Those signals are output from the sense amplifier 33 via the output circuit 32.

The configurations shown in FIGS. 4 and 5 and the operation described with reference to FIG. 6 enable the size of the comparator 201 to be downsized to a large extent. Further, the comparator 201 is reduced in size and simultaneously disposed on the upper substrate 10.

In the output of the buffer 224, the upper substrate 10 and the lower substrate 11 are connected to each other, and thus the upper substrate 10 can be a 3 V system, and the lower substrate 11 can be 1.5 V system. In such a manner, the upper substrate 10 and the lower substrate 11 can be driven by different voltages, so that the power supplies of the upper substrate 10 and the lower substrate 11 can be separated.

Further, the manufacturing processes of the upper substrate 10 and the lower substrate 11 can be separately optimized.

Additionally, it is possible to assign an analog circuit to the upper substrate 10 and a digital circuit to the lower substrate 11. This makes it possible to prevent small analog circuits and digital circuits from being close to each other and being mixed. As a result, a boundary region between analog and digital can be eliminated, which enables downsizing. Such waste that different power supplies are provided in disorder can be eliminated, which also enables downsizing.

It should be noted that in FIG. 5 and the like, specific voltages such as 1.5 V, 2.5 V, and 3 V are shown in the figure, but those voltages are merely examples and are not described for limitation. Further, hereinafter, description will be given with specific voltages as examples, but it is not a description showing limitations.

Incidentally, it is desirable that the power supply on the drain side of the Sr 223 be higher than the power supply of the buffer 224. FIG. 5 exemplifies that the power supply of the Sr 223 is 3 V and the power supply of the buffer 224 is 2.5 V. This is because the SL 222 is floating and thus the voltage varies with time, and when the power supply thereof is set to be higher than the power supply of the buffer 224, the margin of the off state of the PMOS can be earned.

A configuration to provide 3 V may be provided by increasing the gate voltage of the Sr 223 or using a depletion-type transistor for the Sr 223. Alternatively, though not shown in the figure, it is also possible to use a PMOS transistor for the Sr 223 to increase a threshold value or increase the gate voltage in the off state.

As another method of earning the margin of the off state of the PMOS, when an capacitive element is provided to the SL 222, the voltage of the SL 222 can be suppressed from being changed by a dark current.

The power supply of a reset drain of the pixels 21, a threshold value for reset, and a threshold value of the comparison transistor 221 are desirable to be designed so as to satisfy the following conditions.

The voltage of the floating diffusion 103 after being reset is designed to be capable of receiving charge transferred from the photodiode 101. Further, the voltage of the floating diffusion 103 after being reset (the gate voltage of the comparison transistor 221) is designed to be capable of turning off the comparison transistor 221 when the ramp voltage is initially 2 V.

The power supply of the latch circuit 52 is desirably lower than that of the buffer 224. This is because the latch capacitance and the code signal can be reliably separated from each other when the PMOS transistors are turned off. In the case where the area of the photodiode 101 of the pixel 21 is intended to be maximized, a configuration can also be provided, in which the upper substrate 10 and the lower substrate 11 are connected to each other at the SL 222, and the buffer 224 and the Sr 223 are disposed on the lower substrate 11.

<Another Embodiment of Circuit Layout in Each Layer>

Figure 8:
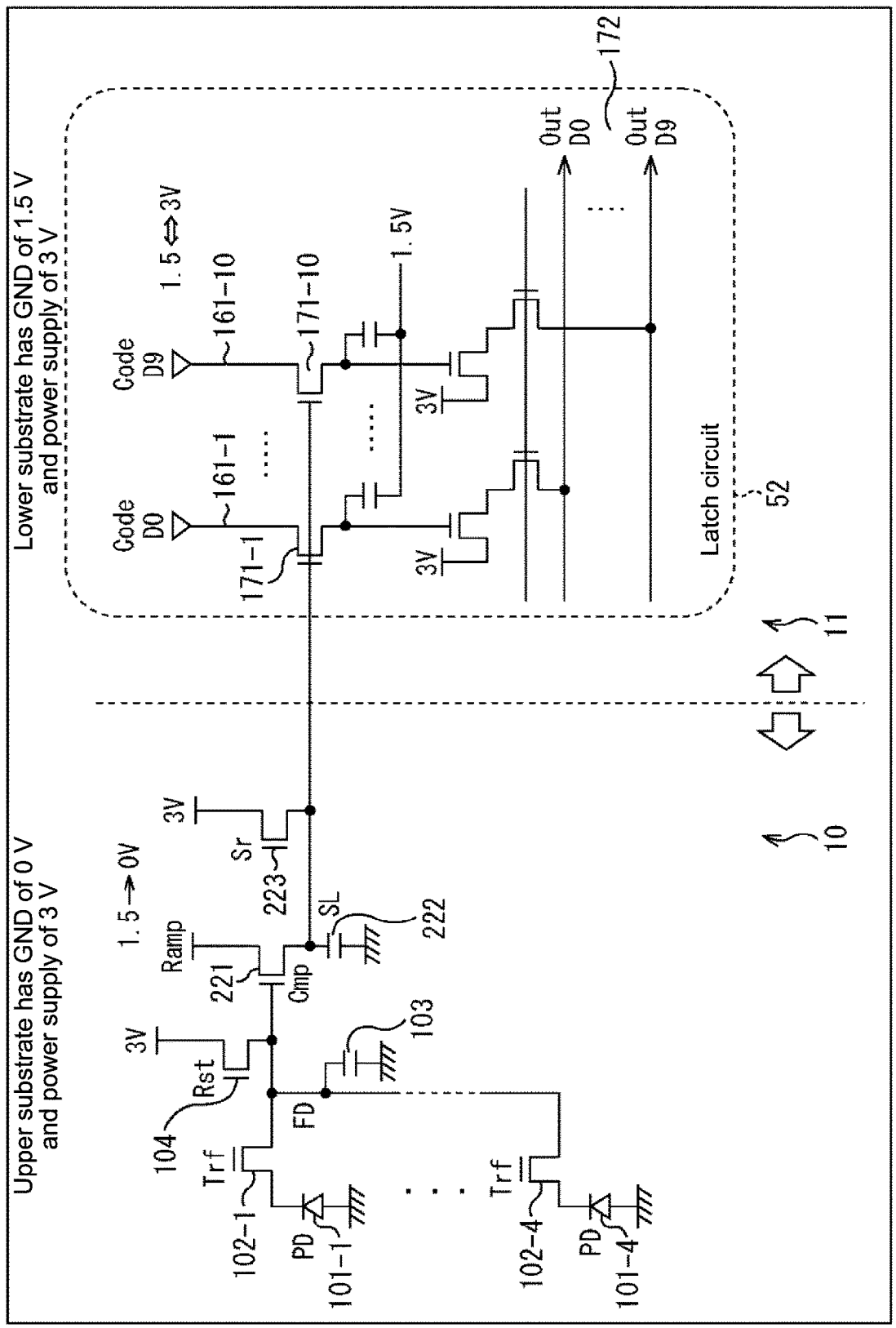
FIG. 8 is a diagram showing a circuit configuration of the imaging device.

FIG. 8 shows a circuit configuration example of another embodiment of a circuit layout in each layer in order to achieve further downsizing of the imaging apparatus. Similar portions to those of FIG. 5 are denoted by the same reference symbols and description thereof will be omitted. In the circuit configuration shown in FIG. 8, all members are constituted by NMOS's (Negative channel Metal Oxide Semiconductor), and operating points are matched.

In the circuit configuration shown in FIG. 8, the upper substrate 10 basically has a low power supply of 0 V and a high power supply of 3 V, and the lower substrate 11 basically has a low power supply of 1.5 V and a high power supply of 3 V. Specifically, the upper substrate 10 and the lower substrate 11 are configured such that the high power supply sides thereof have a common voltage.

Parts corresponding to the pixels 21 in the lower substrate 11 are only the latch circuit 52. The circuit disposed on the upper substrate 10 and the latch circuit 52 disposed on the lower substrate 11 are all constituted by NMOS's. All circuits are constituted by NMOS's, and thus the buffer 224 required in the circuit configuration shown in FIG. 5 can be omitted. FIG. 8 shows an example in which the Sr 223 is disposed on the upper substrate 10.

An operation in the circuit height shown in FIG. 8 is also basically similar to the operation of the circuit configuration shown in FIG. 5. First, pulses are input to the Sr 223, and the SL 222 is reset to have 3 V. In this state, the transistors 181 of the latch columns 161 are turned on, and the code values D0 to D9 each indicating a time are supplied to the capacitive elements of the latch columns 161.

Here, the ramp voltage is gradually reduced from 1.5 V. In this case, the ramp voltage is started not from 2 V but from 1.5 V, which is different from the case of the circuit configuration shown in FIG. 5. From when the ramp voltage passes across a channel voltage of the comparison transistor 221, the comparison transistor 221 is electrically connected. The voltage of the SL 222 is then reduced to be equal to the ramp voltage at once, the latch columns 161 are turned off, the latch capacitance is separated from the code signal, and a value at that time point is held.

Only the gates of the transistors 171 connected to the pixels of the latch columns 161 have voltages lower than 1.5 V (low power supply of the lower substrate 11), and thus the latch columns 161 can be reliably turned off to hold signals. So, it is desirable that an insulating film of each gate of the transistors 171-1 to 171-10 included in the latch columns 161 be made thick to support a high breakdown voltage.

In the circuit configuration shown in FIG. 8, a voltage margin is stricter than the circuit configuration shown in FIG. 5, but further downsizing of the imaging apparatus can be achieved.

Further, since the amplifier transistor 105 in the circuit configuration shown in FIG. 3 outputs a signal while passing a current, power consumption is large. However, according to the circuit configuration shown in FIG. 5 or 8, a steady current is not required to acquire the output from the comparison transistor 221, and thus lower power consumption can be achieved.

Further, since the amplifier transistor 105 outputs the signal while passing a current, there is a high possibility that thermal noise is generated. However, according to the circuit configuration shown in FIG. 5 or 8, the comparison transistor 221 does not pass a current and thus thermal noise is not generated. Therefore, the influence by the thermal noise can be reduced.

It should be noted that the SL (signal line) 222 is floating, and this causes a change in voltage by a dark current in defective pixels. Here, the SL 222 may be configured to be drawn into the power supply side with a minute current in order to avoid floating.

Figure 9:
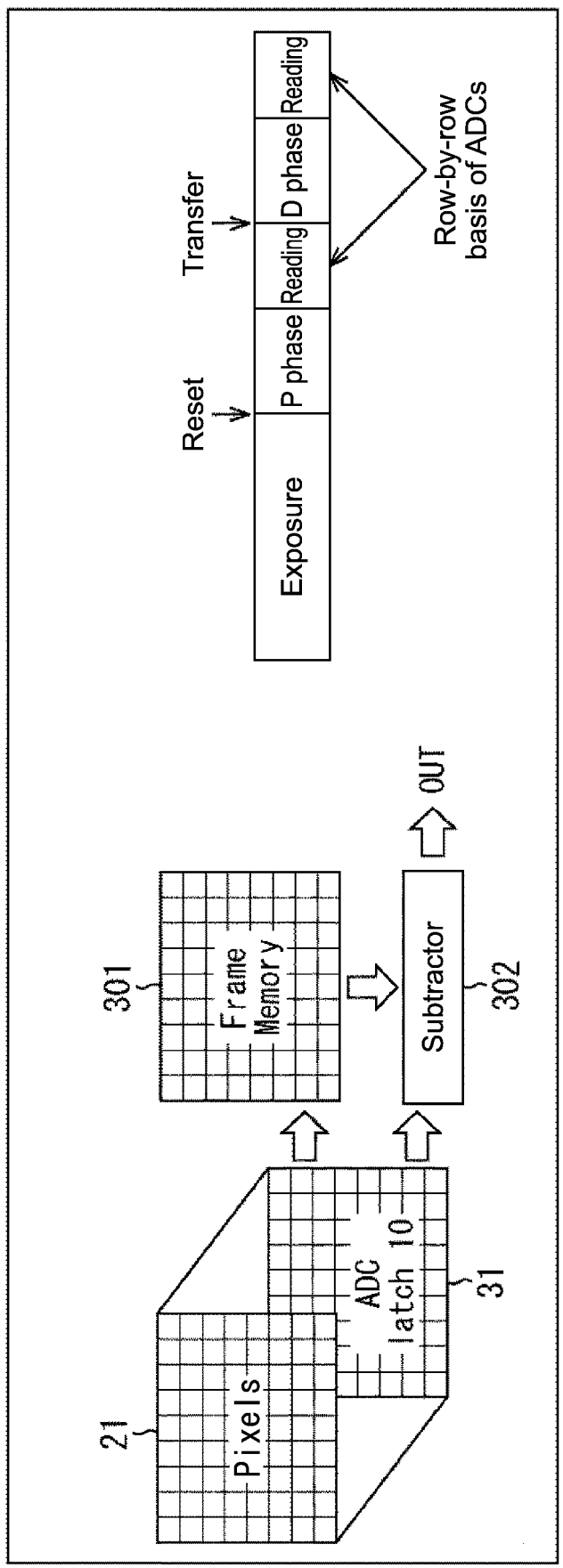
FIG. 9 is a diagram for describing a read operation.
Figure 10:
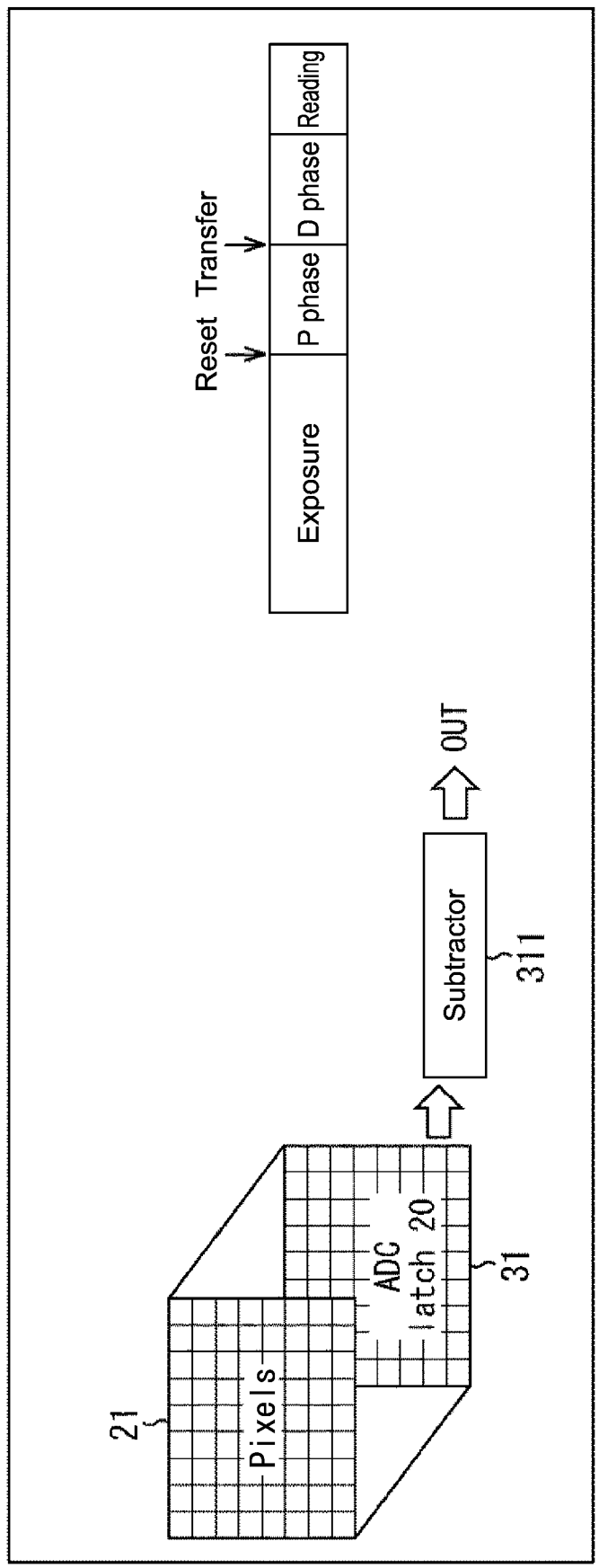
FIG. 10 is a diagram for describing a read operation.

With reference to FIGS. 9 and 10, processing on reading will be additionally described. In FIGS. 9 and 10, description will be given assuming that one ADC 31 is disposed for one pixel for convenience of description.

Applying the present technology enables downsizing of the ADC 31, and even when one ADC 31 is disposed for one pixel, any of the upper substrate 10 and the lower substrate 11 can be downsized. Therefore, a configuration in which one ADC 31 is disposed for one pixel can be provided. Here, description will be continued assuming that one ADC 31 is disposed for one pixel.

Further, as described with reference to FIG. 5 or 8, the ADC 31 is divided and disposed on the upper substrate 10 and the lower substrate 11. In the description with reference to FIGS. 9 and 10, however, parts disposed on the upper substrate 10 and the lower substrate 11 are collectively described as the ADC 31.

Thick-frame arrows in FIGS. 9 and 10 show the flow of signals. The left side of FIG. 9 is a diagram showing a case where AD conversion of 10 bits is performed and ten latch columns 161 are provided, and the right side thereof is a diagram showing a reading order in such a case.

In the pixel 21, a reset operation by the reset transistor 104 and a transfer operation by the transfer transistor 102 are performed. In the reset operation, the voltage of the floating diffusion 103 when the reset transistor 104 performs reset is output as a reset component (P phase) from the pixel 21 to a vertical signal line (not shown).

In the transfer operation, the voltage of the floating diffusion 103 when the charge accumulated in the photodiode 101 is transferred by the transfer transistor 102 is output as a signal component (D phase) to the vertical signal line.

For such a reading, as shown in the right diagram of FIG. 9, exposure is first performed and after the exposure, the floating diffusion 103 is reset and its level is subjected to AD conversion (P-phase period). In the P-phase period, a value output from the latch circuit 261 (FIG. 5 or 8) is read on a row-by-row basis of the ADCs 31 and stored in a frame memory 301.

After the P-phase period, photoelectrons of the photodiodes 101 are transferred to the floating diffusion 103, and its level is subjected to the AD conversion (D-phase period). In the D-phase period, a value output from the latch circuit 261 (FIG. 5 or 8) is read on a row-by-row basis of the ADCs 31 and supplied to the subtractor 302.

The subtractor 302 subtracts the value, which is read in the D-phase period, from the value, which is read in the P-phase period and stored in the frame memory 301, to obtain a signal. Such exposure, P phase, and D phase are simultaneously performed on all the pixels.

In the case where one ADC 31 is assigned to a plurality of pixels 21, "P phase, reading, D phase, and reading" is sequentially performed on pixels one by one.

The left side of FIG. 10 is a diagram showing a case where AD conversion of 10 bits is performed and twenty latch columns 161 are provided, and the right side thereof is a diagram showing a reading order in such a case. Providing twenty latch columns 161 enables a configuration in which the value of 10 bits of the P-phase period and the value of 10 bits of the D-phase period can be held.

As described above, in the case where the ADC 31 includes both a P-phase latch and a D-phase latch, the configuration in which the frame memory 301 is removed can be provided, and the processing of transferring the value obtained from the ADC 31 to the frame memory 301 can be omitted.

In the case of the configuration shown in FIG. 10, after the exposure, the floating diffusion 103 is reset, its level is subjected to AD conversion (P-phase period), and the value is stored in the P-phase latch. At the next timing, the photoelectron of the photodiode 101 is transferred to the floating diffusion 103, and its level is subjected to the AD conversion (D-phase period) and stored in the D-phase latch.

The values stored in the P-phase latch and the D-phase latch are read on a row-by-row basis of the ADCs 31 and subtracted by the subtractor 311, so that a signal is output.

In such a manner, the reading from the ADCs 31 is performed. It should be noted that the imaging apparatus, the frame memory 301, and the subtractor 302 (or 311) may be integrated or separated as different chips.

In the embodiment described above, the pixels 21 and the ADCs 31 have been mainly described, but a circuit other than the ADC 31 may be employed and, for example, digital processing for latched data may be performed.

It should be noted that in the embodiment described above, the configuration in which the NMOS's and the PMOS's are all switched can be provided. In such a configuration, the voltages can be inverted for operation.

<Configuration with Reduced Number of Latches>

In the embodiment described above, the case where the comparator 201 and the latch circuit 52 included in the ADC 31 are disposed on the upper substrate 10 and the lower substrate 11, respectively, and the configuration of the comparator 201 is constituted using, for example, the comparison transistor 221 has been described as an example.

Next, description will be given on achievement of the downsizing of the latch circuit 52 by reducing the number of latch columns 161 of the latch circuit 52.

Figure 11:
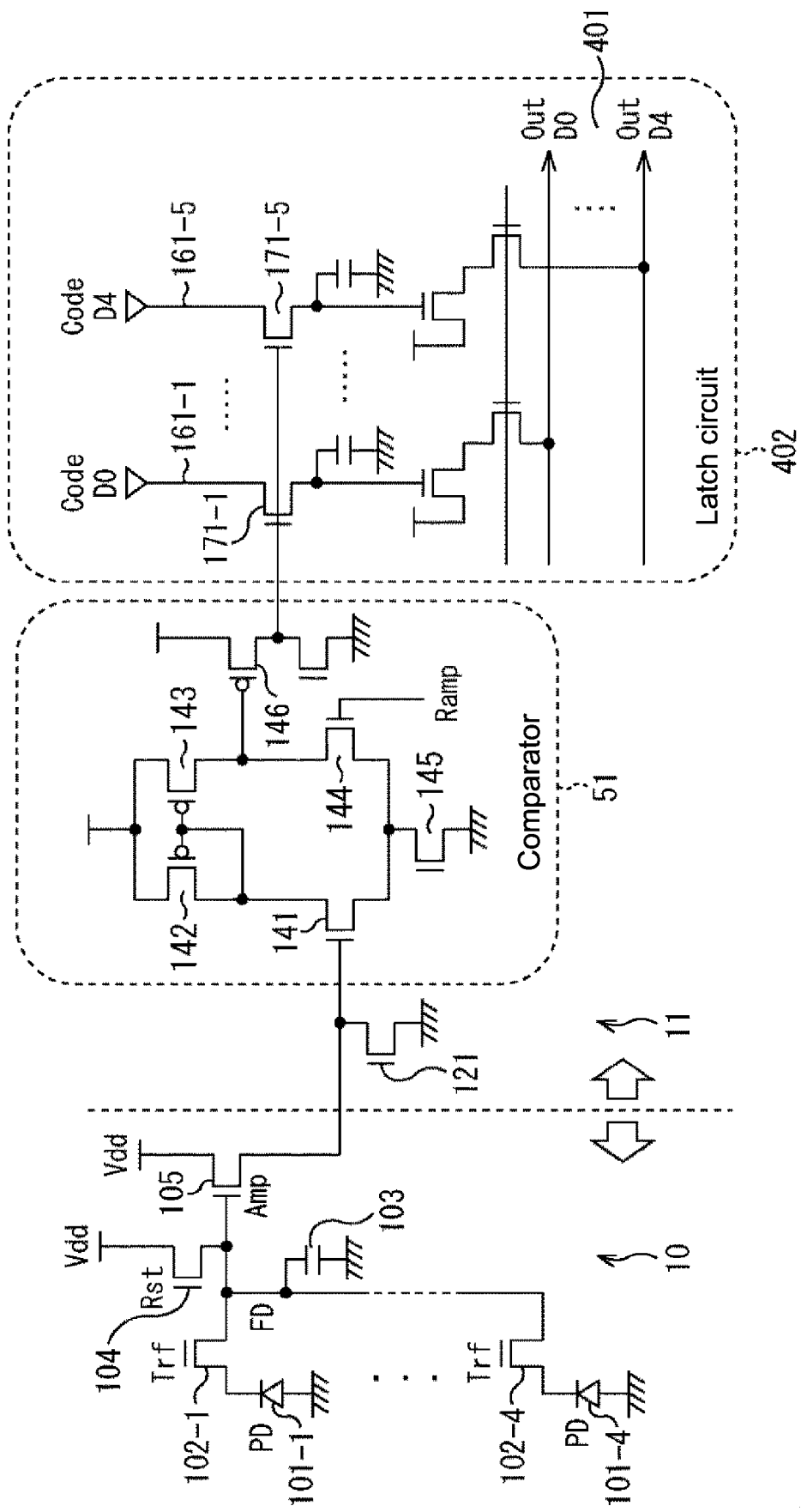
FIG. 11 is a diagram showing a circuit configuration of the imaging device.

FIG. 11 is a diagram showing a circuit configuration of the imaging apparatus. When the circuit configuration of the imaging apparatus shown in FIG. 3 and the circuit configuration shown in FIG. 11 are compared with each other, the latch circuit 52 and a latch circuit 402 are different from each other in configuration. The latch circuit 52 shown in FIG. 3 includes ten latch columns 161 of the latch columns 161-1 to 161-10, but the latch circuit 402 shown in FIG. 11 is different from the latch circuit 52 in that five latch columns 161 of the latch columns 161-1 to 161-5 are provided.

In this case, the example in which the number of latch columns 161 is reduced to the half from ten to five has been described. In such a manner, even when the number of latch columns 161 is reduced, performing processing as described below can provide the value of 10 bits as in the case where ten latch columns 161 are provided.

Figure 12:
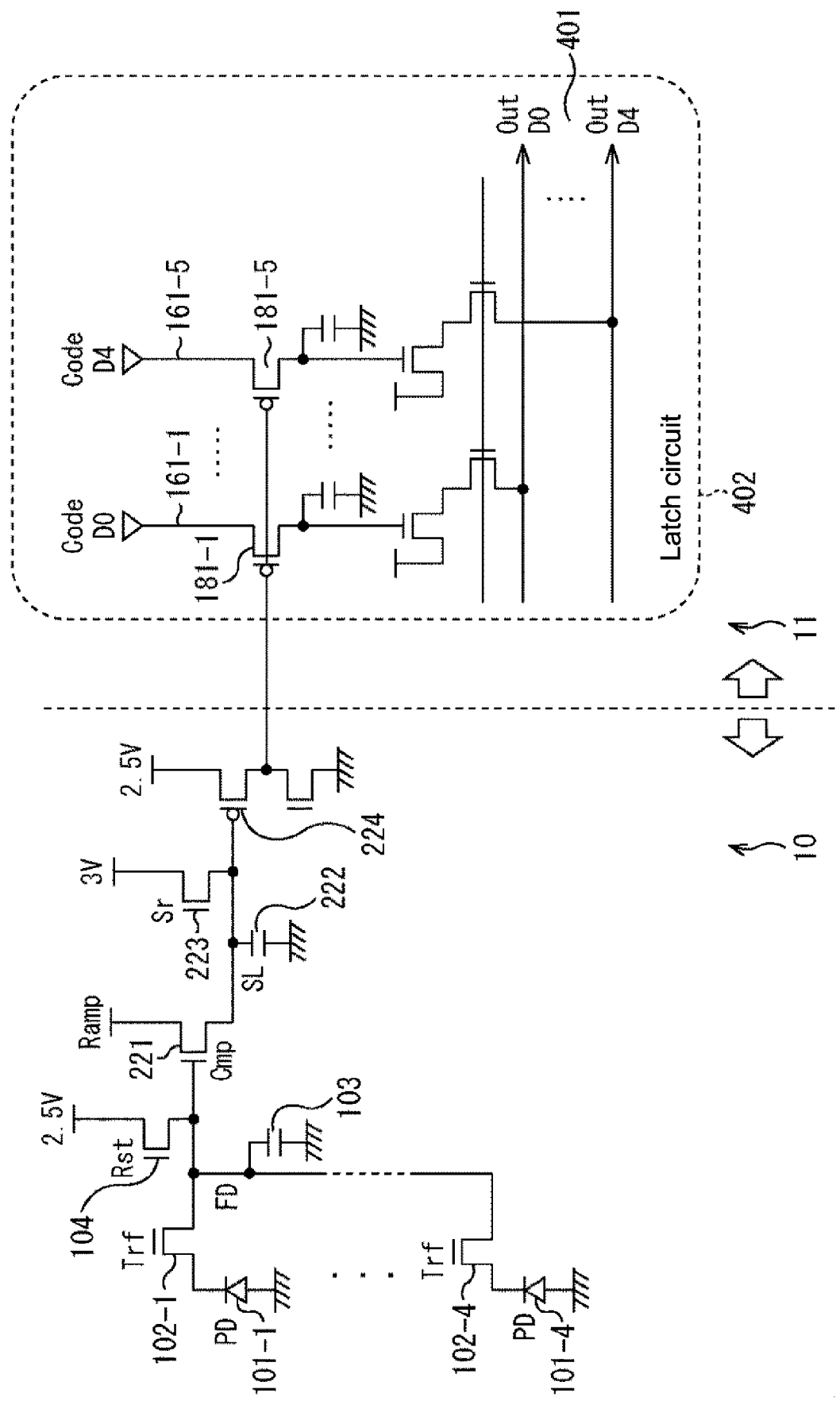
FIG. 12 is a diagram showing a circuit configuration of the imaging device.

The circuit configuration example shown in FIG. 11 shows the example in which the number of latch columns 161 is reduced from the circuit configuration shown in FIG. 3. However, a circuit configuration in which the number of latch columns 161 is reduced from the circuit configuration shown in FIG. 5 or 8 can also be provided. FIG. 12 is a diagram showing a circuit configuration in which the number of latch columns 161 is reduced from the circuit configuration shown in FIG. 5.

When the circuit configuration of the imaging apparatus shown in FIG. 5 and the circuit configuration shown in FIG. 12 are compared with each other, the latch circuit 202 and the latch circuit 402 are different from each other in configuration. The latch circuit 202 shown in FIG. 5 includes ten latch columns 161 of the latch columns 161-1 to 161-10, but the latch circuit 402 shown in FIG. 12 is different from the latch circuit 202 in that five latch columns 161 of the latch columns 161-1 to 161-5 are provided.

Also in the circuit configuration of the imaging apparatus shown in FIG. 8, though not shown in the figure, it is possible to reduce the number of latch columns 161 included in the latch circuit 202 by applying the following processing.

The configuration other than the latch circuit 402 is similar to the circuit configuration shown in FIG. 3, 5, or 8, and overlapping description on parts of the similar configuration is omitted as necessary in the following description.

Hereinafter, description will be continued using the circuit configuration shown in FIG. 11.

In the case of the circuit configuration shown in FIG. 11, the output from the comparator 51 is input to the gates of the transistors 171 that turn the latch circuit 402 on and off. The latch circuit 402 includes five latch columns 161-1 to 161-5 and thus has 5 bits, and code values D0 to D4 including a high or low voltage are input thereto.

When the output of the comparator 51 is high, the latch circuit 402 is turned on, and the code values D0 to D4 are input to a latch capacitance. When the output of the comparator 51 is low, the latch circuit 402 is turned off, and the code values D0 to D4 are not input to the latch capacitance. High/low of the voltage of the latch capacitance is output as Out D0 to D4 (hereinafter, described as outputs D0 to D4), by an output stage 401 below, to the sense amplifier 33 (FIG. 1) of the next stage.

Figure 13:
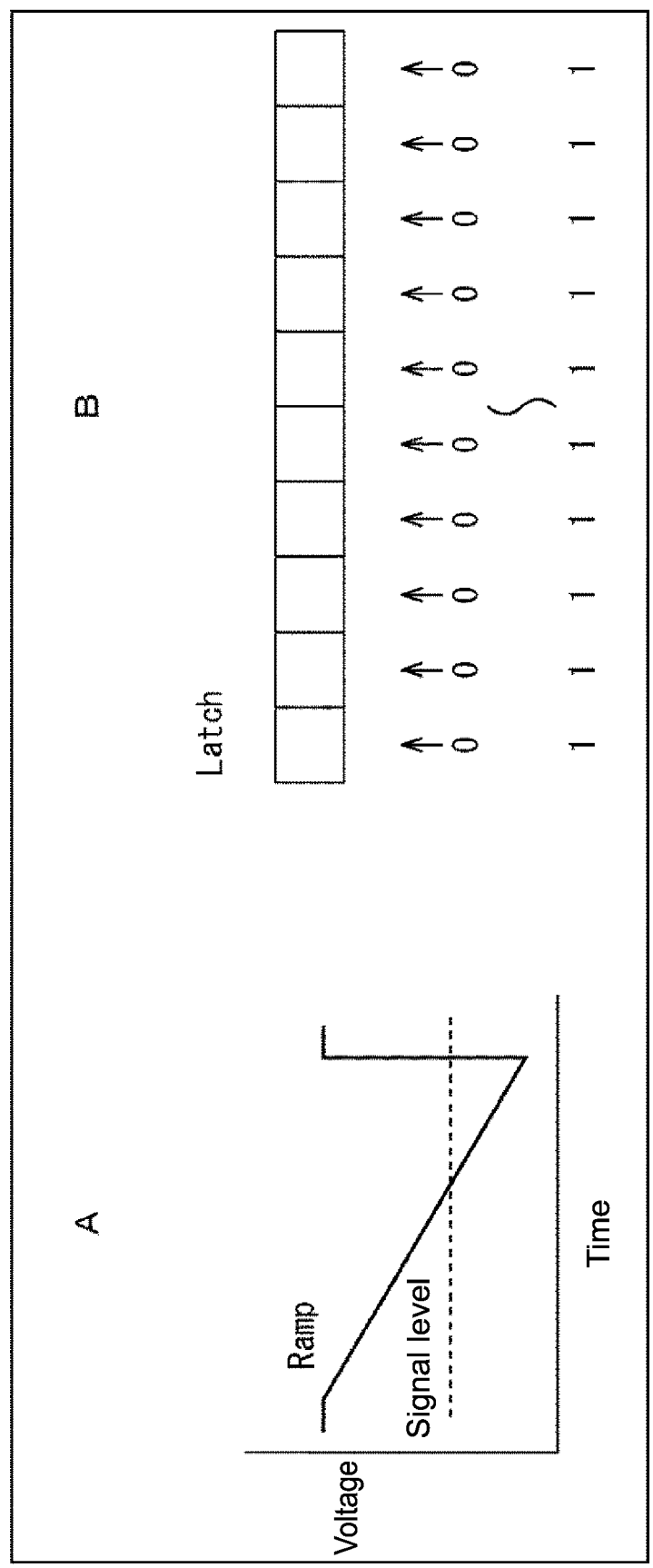
FIG. 13 is a diagram for describing a read operation.

Also in such a configuration, a basic operation is similar to that of the case described above. Specifically, a ramp signal as shown in A of FIG. 13 is input to the comparator 51. The ramp signal (solid line denoted as Ramp) is a signal having a voltage gradually reduced with time.

In the case where the ramp voltage of the ramp signal input to the comparator 51 is higher than the voltage (in A of FIG. 13, dotted line denoted as signal level) input via the signal line from the pixels 21 side, the output from the comparator 51 is high and the latch circuit 402 is turned on. When the latch circuit 402 is turned on, in the latch capacitance, the code values D0 to D4 that count up with time are supplied to the latch columns 161-1 to 161-4, respectively.

When the ramp voltage is gradually reduced and lower than the voltage of the signal line, the output of the comparator 51 is inverted and the latch circuit 402 is turned off. The code value when the latch circuit 402 is turned off is held in the latch capacitance. Thus, the output of the pixels 21 is digitized.

In such a manner, the processing in the latch circuit 402 is performed. Here, refer back to FIG. 3 again. In the case where 10 latches of the latch columns 161-1 to 161-10 are provided as in the latch circuit 52 shown in FIG. 3, values of 10 bits "0000000000" to "1111111111" are output as shown in B of FIG. 13.

Specifically, ten latch columns 161 are provided, and while the ramp voltage and the signal from the pixels are compared with each other as shown in A of FIG. 13, in the latch of 10 bits, the code values D0 to D9 that count up from "0000000000" to "1111111111" are input. When the hierarchical relationship between the ramp voltage and the signal voltage is inverted, the latch is separated from the code values and those values are held. Thus, when the held values are read, the signal level is found.

In contrast to this, the latch circuit 402 is different from the latch circuit 52 in a configuration in which the number of latch columns 161 is reduced to the half, five. So, when the ramp signal shown in A of FIG. 13 is applied and the similar processing as in the case described above is performed, values of 5 bits are obtained and values of 10 bits are not obtained. In this regard, a ramp signal as shown in A of FIG. 14 is used.

Figure 14:
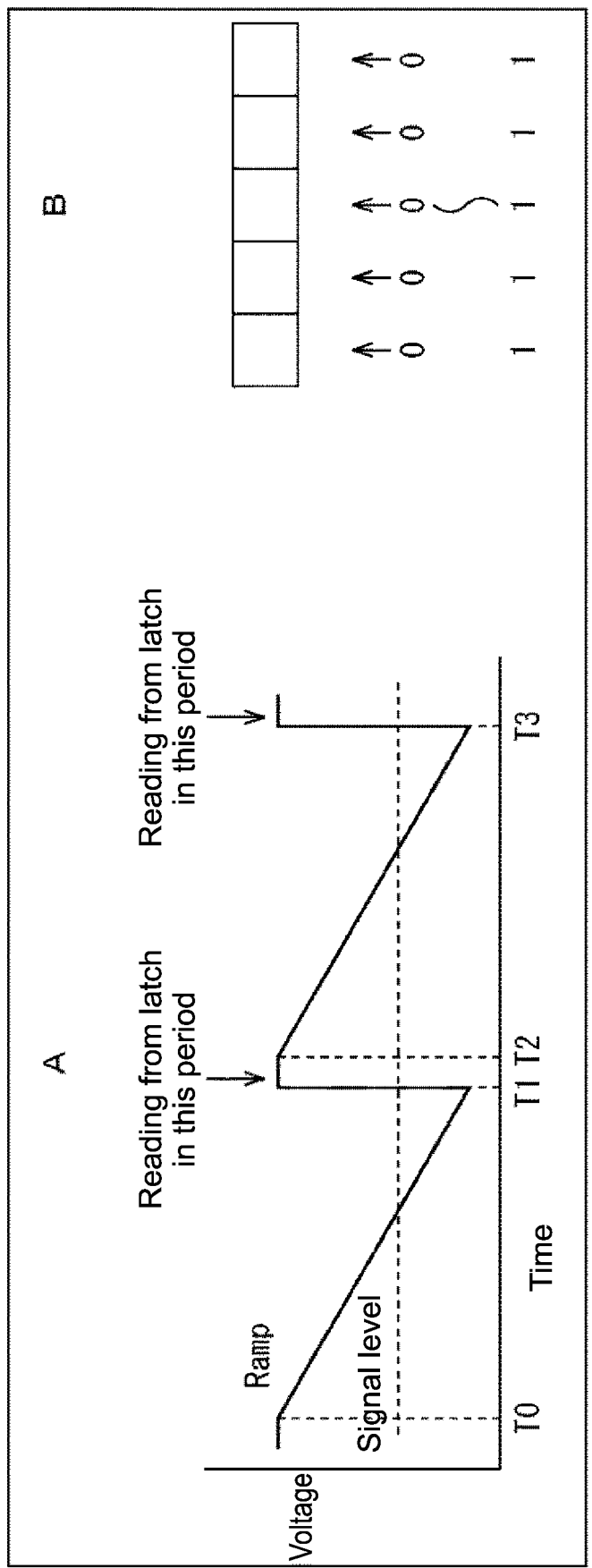
FIG. 14 is a diagram for describing a read operation.

The ramp signal shown in A of FIG. 14 is a signal to which ramps are input two times in order to obtain values of 10 bits. Here, a ramp signal from time T0 to time T1 is described as a first ramp, and a ramp signal from time T2 to time T3 is described as a second ramp.

The first ramp output from time T1 to time T2 is a ramp for receiving inputs of 5 low-order bits as code values and obtaining the output values of 5 low-order bits. For the 5 low-order bits, as shown in B of FIG. 14, code values from "00000" to "11111" are repeated 32 times, and sometime during that time, the hierarchical relationship between the ramp voltage and the signal voltage is inverted, and the code values at that time are held in the latch. After that, the 5 low-order bits are read from the outside from time T1 to time T2.

The time from time T1 to time T2 is a time for switching from the first ramp to the second ramp, during which the values of the 5 low-order bits are read from the latch circuit 402.

After that, from time T2 to time T3, a second ramp is input. In the second ramp, 5 high-order bits as code values count up from "00000" to "11111" in a 32-fold slow cycle. Sometime during that time, the hierarchical relationship between the ramp voltage and the signal voltage is inverted, and the code values at that time are held in the latch. After that, the 5 high-order bits are read from the outside.

In such a manner, the ramps are input two times, and the values of 5 bits obtained in the respective ramps are assumed as the 5 low-order bits and the 5 high-order bits, thus obtaining the values of 10 bits. Further, the cycle for the first ramp and the cycle for the second ramp are different from each other. The ramp when the high-order bits are acquired has a cycle slower than the ramp when the low-order bits are acquired. Here, the case of the 32-fold cycle has been exemplified.

Figure 15:
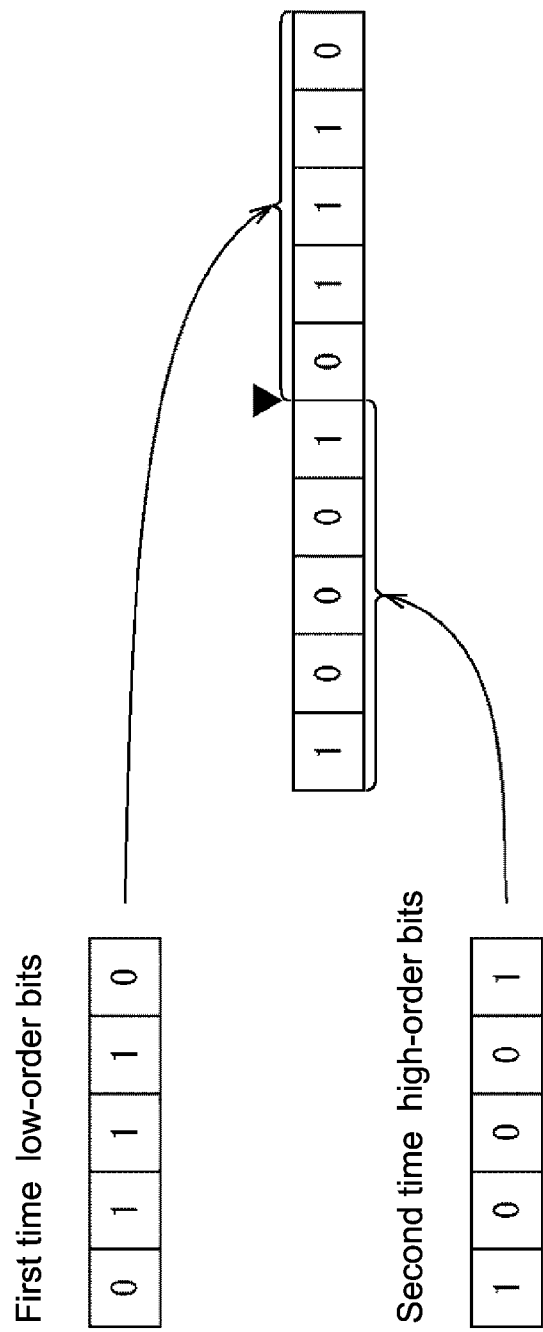
FIG. 15 is a diagram for describing integration of high- and low-order bits.

FIG. 15 shows an example. In the example shown in FIG. 15, the values of 5 low-order bits of "010110" are acquired in the first ramp, and the values of 5 high-order bits of "10001" are acquired in the second ramp. By combination of the 5 low-order bits and the 5 high-order bits, a digital value of 10 bits "1000101110" is completed.

In such a manner, by using a ramp signal having two ramps to acquire the 5 low-order bits and the 5 high-order bits, the output value of 10 bits can be obtained even with the latch circuit 402 including five latch columns 161.

It should be noted that in the description above, the code values of the 5 high-order bits are input in the 32-fold cycle in the second ramp, but it is also possible to set the inclination of the ramp signal to be 32-fold so as not to change the cycle of the code values. The former is suitable when the priority is given to accuracy, and the latter is suitable when the priority is given to speed.

Further, in the description above, the 5 low-order bits are determined in the first ramp, and the 5 high-order bits are determined in the second ramp. However, the 5 high-order bits may be determined in the first ramp and the 5 low-order bits may be determined in the second ramp.

However, as described above, it seems to be desirable that the 5 low-order bits are determined in the first ramp and the 5 high-order bits are determined in the second ramp. This is because a signal from the pixels 21 may gradually fluctuate by the influence of a dark current and the like, and the 5 low-order bits are desirably determined earlier.

Incidentally, two ramps are input in order to obtain a value of 10 bits, but there is a time difference between the first ramp and the second ramp. There is a possibility that the signal of the pixels 21 varies from the first ramp to the second ramp. This will be described with reference to FIG. 16.

It is assumed that the signal of the pixels 21 is "0000100000" in the first ramp. Since 5 low-order bits are acquired in the first ramp, in this case, "00000" is acquired.

Also in the second ramp, the signal of the pixels 21 is "0000100000" normally, and "00001" of the 5 high-order bits is acquired.

Figure 16:
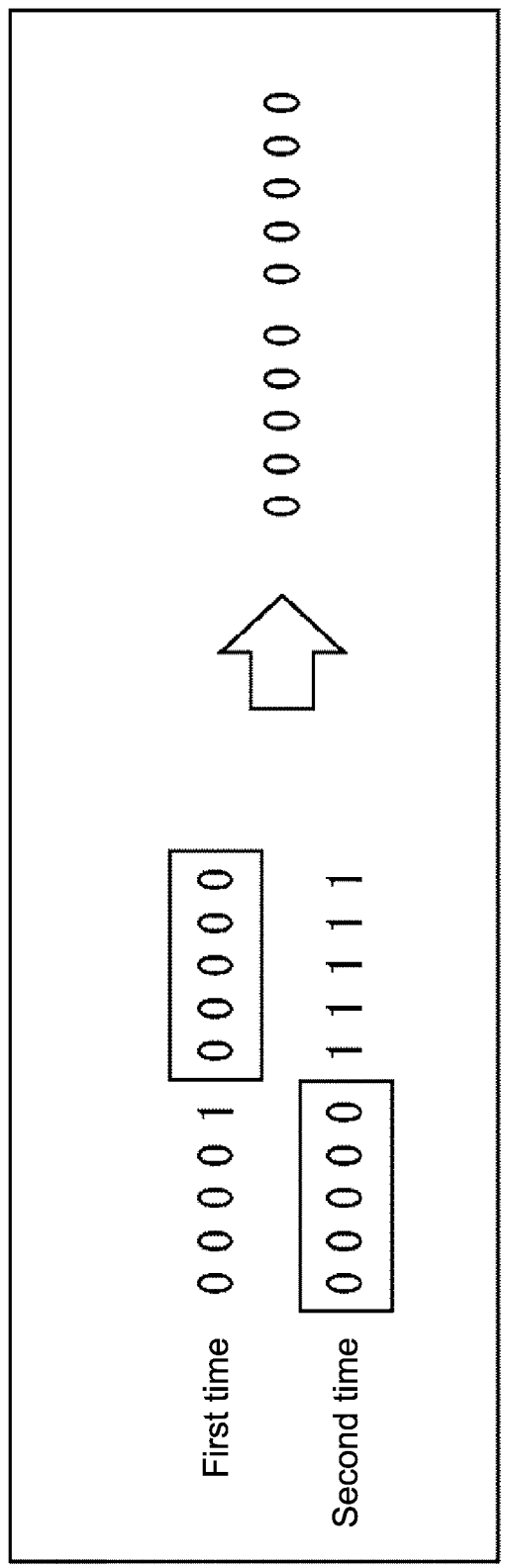
FIG. 16 is a diagram for describing integration of high- and low-order bits.

However, in the case where the signal of the pixels 21 is slightly varied to "0000011111" in the second ramp due to some influences, "00000" of the 5 high-order bits is acquired. Therefore, in this case, as shown in FIG. 16, the value finally acquired is "0000000000". When the value of "0000100000" is to be acquired normally, there is a possibility that a different value of "0000000000" is acquired.

In this case, from the first ramp to the second ramp, the signal of the pixels 21 is merely changed from 32 to 31 by 1 in the decimal system, and from "0000000000" to "0000011111" in the binary system as well. However, in the case where the two ramps are input and 5 bits are acquired in each time, as described above, there is a possibility that the value of "0000000000" is acquired when "0000100000" should be acquired. This means that if the value is represented by the decimal system, when a value of 32 is acquired normally, 0 is acquired.

In such a manner, in the case where the image signal is varied in such a manner that the sixth bit is affected, a phenomenon may occur in which even though the signal is slightly changed but a result of the AD conversion is a totally different value. In order that such a value is not largely changed, the following countermeasures can be taken.

First, for a countermeasure 1, a Gray code can be used as the code value. The Gray code is used in terms of the fact that the Gray code always changes by only one bit when changing from a certain value to an adjacent value.

With the Gray code, around "00000" of the 5 low-order bits, a digit immediately thereabove is not changed, and thus there is a low possibility that the above-mentioned large change of the value occurs. Considering that a carry occurs in the sixth digit, . . . 10001, 10000, 110000, 110001, . . . are conceived, and the 5 low-order bits are symmetric around the carry. Thus, even if the sixth digit is changed, a totally different value is not obtained as in the case of the binary code.

For example, in the first ramp of "0000110000", "10000" is acquired as the 5 low-order bits, but in the second ramp, if the value of the signal is reduced by 1, that is, changed to "0000010000", and the 5 high-order bits are "00000", the combination is "0000010000". The result of the AD conversion is a value reduced by 1.

Further, for example, in the first ramp of "0000110001", "10001" is acquired as the 5 low-order bits, but in the second ramp, if the value of the signal is reduced by 2 and "00000" is acquired as the 5 high-order bits, the combination is "0000010001". The result of the AD conversion is a value reduced by 3.

The same holds true for the case where the pixel value increases conversely and a carry occurs. In the Gray code, the following case is not caused, in which a signal change of pixels is small but a result of the AD conversion is a quite different value, as in the case of the binary code.

It should be noted that the Gray code may be used for all the bits. However, in consideration of a variation value of the image signal, noise, and the like, the Gray code and the binary code can be used in combination in such a manner that the Gray code is used for low-order bits in a variable range and the binary code is used for others above the range.

Even in the Gray code, when the image signal is varied across the carry or borrow of the sixth digit, the result of the AD conversion does not match a true value. For a countermeasure 2, this can be solved by sharing one digit out of a value obtained in the first ramp and a value obtained in the second ramp in the binary code.

In the first ramp, the 5 low-order bits are converted, as in the case described above. In the second ramp, the fifth to ninth digits are input as the code values. As a result, the AD conversion of not 10 bits but 9 bits is performed. In the case where the value of the fifth digit in the second time is different from the value of the first time, the value of the first time is adopted and corrected together with the sixth digit.

Figure 17:
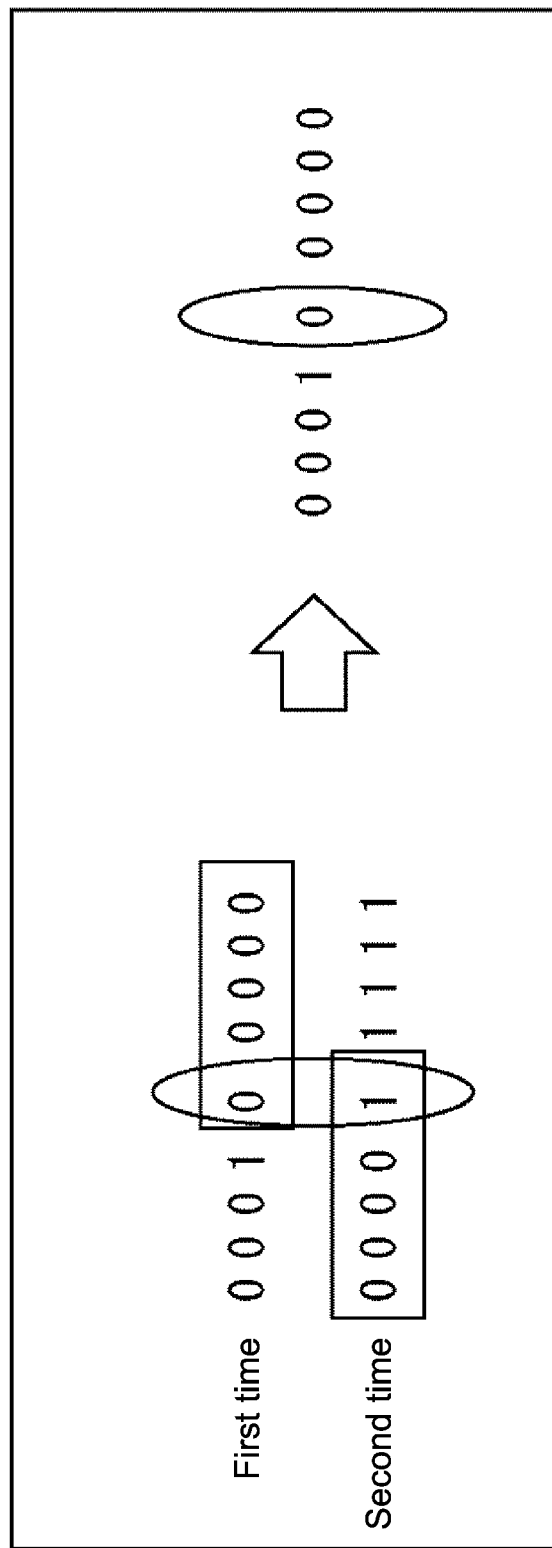
FIG. 17 is a diagram for describing integration of high- and low-order bits.

For example, as shown in FIG. 17, assuming the following case: the signal in the first ramp is "0000100000" and 5 low-order bits thereof is "00000", but the signal in the second ramp is changed to "0000011111", and as a result, "00001" is acquired as high-order bits. In this case, in the left diagram of FIG. 17, a portion enclosed in an ellipse, that is, the first digit "0" acquired in the first ramp and the fifth digit "1" acquired in the second ramp should be the same value normally, but are different from each other.

In such a case, referring to the value acquired in the first ramp, it is determined that the difference is due to a borrow, the 5 high-order bits are corrected to "00010", and "000010000" is acquired as a final result.

In the case where the value acquired in the first ramp is "11111" or the like, and the value acquired in the second ramp is "****0", it is possible to determine that a carry has occurred. Specifically, it may be possible to determine that when the fourth digit in the first time is 0, a borrow has occurred and that when the fourth digit in the first time is 1, a carry has occurred. In such a manner, it is also possible to configure a digital signal so as to be corrected by the value of a bit that is one-order lower than the shared bit.

If the shared digit and a digit one-order lower than the shared digit are binary codes, the other digits may be Gray codes.

Figure 18:
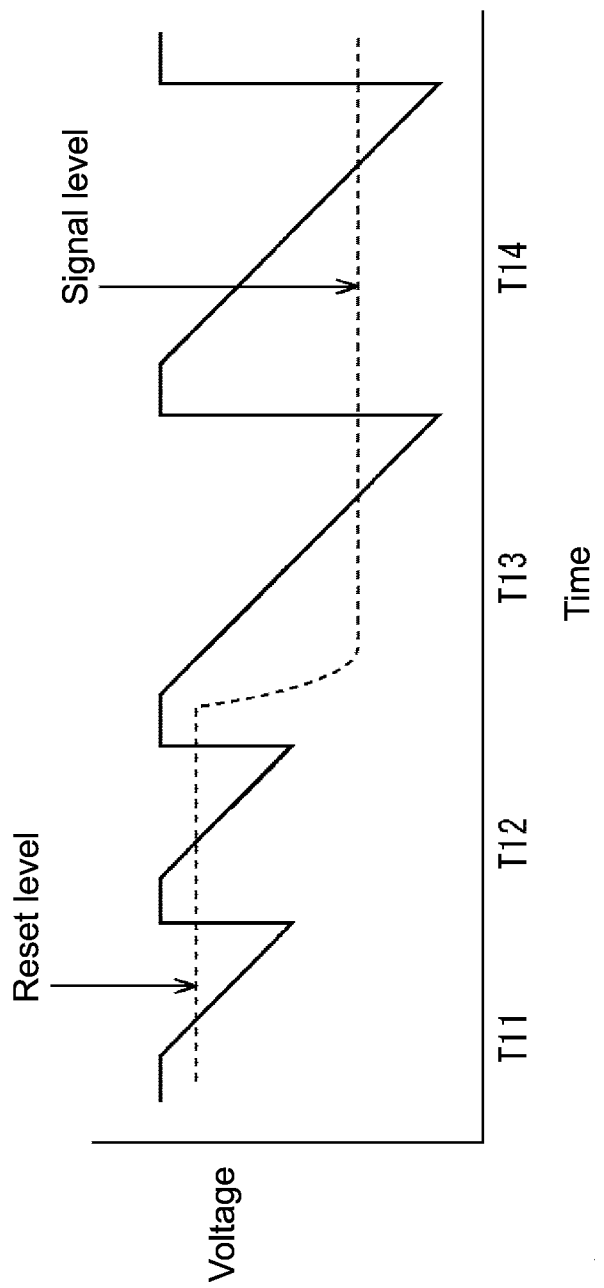
FIG. 18 is a diagram for describing a read operation.

In such a manner, even if the bit number of the latch circuit 402 is reduced, two ramps are input so that a value of 10 bits (or 9 bits) can be created. In such a case as well, the pixels 21 output a reset level and a signal level. The reset level is a reference voltage at that time of the pixels. The difference between the signal level and the reset level is a true signal value. FIG. 18 shows a corresponding operation.

In both of the reset level and the signal level, two ramps are input and the AD conversion is performed as described above. With reference to FIG. 18, at time T11, a first ramp for the reset level is input, and at the next time T12, a second ramp for the reset level is input.

At the next time T13, a first ramp for the signal level is input, and at time T14, a second ramp for the signal level is input. In such a manner, digital values are output in the order of 5 low-order bits of the reset level, 5 high-order bits thereof, 5 low-order bits of the signal level, and the 5 high-order bits thereof.

Those digital signals are stored in the frame memory 301 of the next stage as in the case described with reference to FIG. 9. At a stage where the 5 high-order bits of the signal level are finally obtained, a subtraction of the reset level from the signal level is performed in the subtractor 302. The imaging apparatus and the frame memory 301 or subtractor 302 may be different semiconductor devices or may be integrated.

Figure 19:
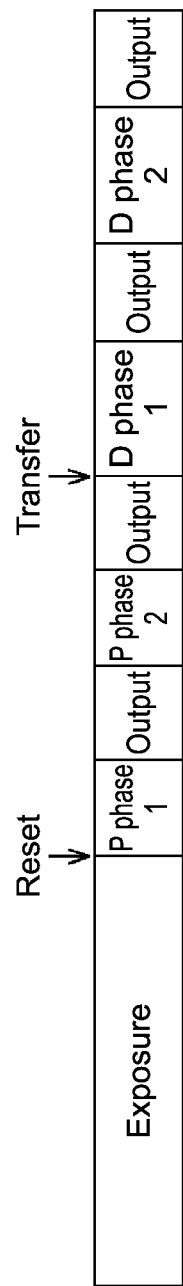
FIG. 19 is a diagram for describing a read operation.

FIG. 19 is a diagram for describing an operation of the ADC 31 when an output value of 10 bits is created by inputs of the two ramps. After exposure, the floating diffusion 103 of the pixels 21 is reset and the level thereof is subjected to AD conversion (P-phase period). A P phase 1 is a period in which the 5 low-order bits are converted and output to the sense amplifier 33. A P phase 2 is a period in which the 5 high-order bits are converted and output to the sense amplifier 33.

After the output of the P phase 2 is terminated, the photoelectrons of the photodiodes 101 are transferred to the floating diffusion 103. The conversion and the output are thus repeated two times. The conversions of the P phase 1, the P phase 2, a D phase 1, and a D phase 2 are performed by all the ADCs 31 operating in parallel. The output to the sense amplifier 33 is performed while scanning the ADCs 31 on a row-by-row basis. In the case where one ADC 31 corresponds to a plurality of pixels 21, each pixel is sequentially selected and this operation is repeated.

Since the reset level is distributed in a narrow range, a corresponding ramp signal may be short as shown in FIG. 18. Specifically, as shown in FIG. 18, a fluctuation range of the voltage of the ramp signal at the detection of the reset level may be smaller than the fluctuation range of the voltage of the ramp signal at the detection of the signal level. Further, a cycle of the ramp signal at the detection of the reset level may be shorter than the cycle of the ramp signal at the detection of the signal level.

In the four ramps including the signal level, only the ramps in that range are made to be straight lines. In portions corresponding to large signal values, the inclination of the ramps is made sharp or the count-up speed of the code values is reduced. Thus, the scale of the AD conversion on the high-intensity side can be widened and the data amount can be reduced.

Specifically, the following signal may be used, in which a change in voltage of the ramp signal when a signal on the high-intensity side of the signal level is acquired is sharper than a change in voltage of the ramp signal when a signal on the low-intensity side is acquired. Alternatively, the speed at which the code value D is supplied to the latch circuit 402 when the signal on the high-intensity side of the signal level is acquired may be slower than the speed at which the code value D is supplied to the latch circuit 402 when the signal on the low-intensity side is acquired. In such a manner, the data amount can be reduced.

In such a case, by referring to the reset level value and calculating a difference from a bending point in the subtractor 302, and thus correcting the value on the high-intensity side, a correct value can be obtained after the subtraction. The bending point is a time point at which a change in voltage of the ramp signal is made sharp or a time point at which the speed for supply of the code value is changed. Since the reset level is distributed in a narrow range, if that range falls within 1/32 of the D phase or smaller, one ramp may suffice for the reset level.

Incidentally, the above embodiments have described that when the latch circuit 52 including ten latch columns 161-1 to 161-10 is used, one ramp is input, and when the latch circuit 402 including five latch columns 161-1 to 161-5 is used, two ramps are input.

The number of latch columns and the times ramps are input are not limited to such combinations, but are examples. For example, the following configuration can be possible: three latch columns are provided and three ramps are input, so as to obtain an output value of 9 bits.

Further, for example, in the case where three ramps are input, it may be possible to acquire high-order bits, low-order bits, and middle-order bits between the high-order bits and the low-order bits and to generate a digital value by combinations of the high-order bits, the middle-order bits, and the low-order bits.

Considering such a case, for example, inputting ramps by times corresponding to a bit number is also conceivable. Also in the case where the present technology is applied and ramps are input by a plurality of times corresponding to a bit number, the operation of the slope-type ADC is provided, and if the ramp is extended to the case of being input by the times corresponding to a several bit number, any ramp is swept similar to the slope-type ADC. Since the ramp waveform may be equal in each time, good reproducibility is obtained. Therefore, the accuracy of the AD conversion can be kept high.

Therefore, if the ramp is input by times corresponding to a bit number, according to the present technology, highly accurate AD conversion can be performed.

According to the present technology, the solid-state imaging device can be downsized. Further, since one ADC is provided for a smaller number of pixels, high-speed processing can be achieved. Further, even if an object to be imaged has a motion, imaging with less distortion can be performed.

Further, a configuration with low power consumption can be provided. Further, it is possible to avoid mixing small-scale analog circuits and digital circuits and optimize voltages and manufacturing processes in the upper substrate and the lower substrate individually.

<Electronic Apparatus>

The present disclosure is not limited to be applied to the imaging apparatus but applicable to overall electronic apparatuses using an imaging apparatus for an image capturing unit (photoelectric conversion unit), including imaging apparatuses such as a digital still camera and a video camera, portable terminal devices having an imaging function such as mobile phones, copying machines using the imaging apparatus for an image reading unit, and the like. It should be noted that the above-mentioned module-like form mounted to the electronic apparatus, that is, a camera module, may be used as an imaging apparatus.

Figure 20:
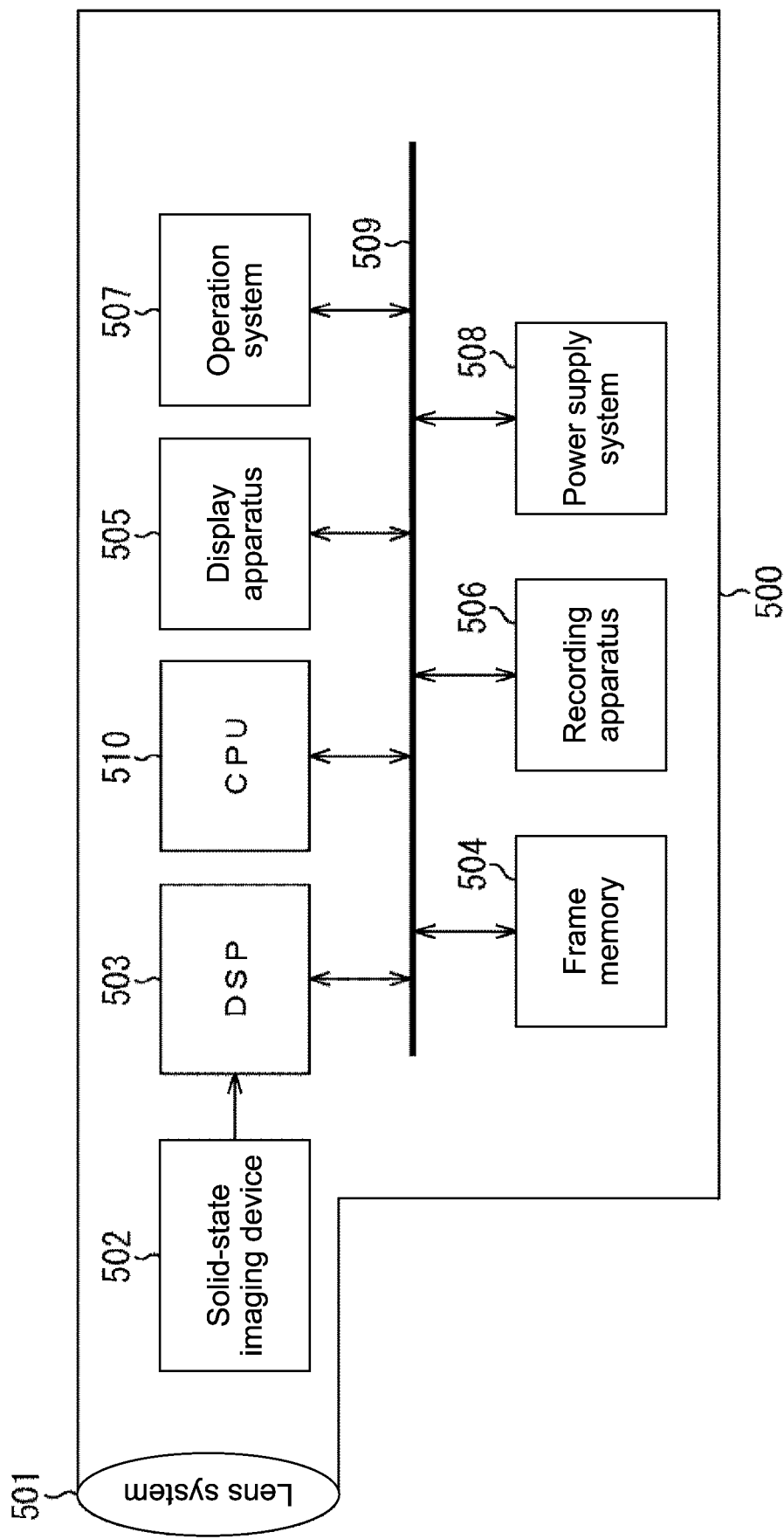
FIG. 20 is a diagram showing a configuration of an electronic apparatus.

FIG. 20 is a block diagram showing a configuration example of the imaging apparatus as an example of an electronic apparatus of the present disclosure. As shown in FIG. 20, an imaging apparatus 500 of the present disclosure includes an optical system including a lens group 501 and the like, an imaging device 502, a DSP circuit 503 serving as a camera signal processing unit, a frame memory 504, a display apparatus 505, a recording apparatus 506, an operation system 507, a power supply system 508, and the like.

The DSP circuit 503, the frame memory 504, the display apparatus 505, the recording apparatus 506, the operation system 507, and the power supply system 508 are configured to be connected to one another via a bus line 509. The CPU 510 controls units of the imaging apparatus 500.

The lens group 501 takes in incident light (image light) coming from a subject, and forms an image on an imaging surface of the imaging device 502. The imaging device 502 converts the amount of incident light, with which the image is formed on the imaging surface by the lens group 501, into an electrical signal on a pixel-by-pixel basis. The imaging device 502 outputs the electrical signal as an image signal. The solid-state imaging device according to the embodiments described above can be used as the imaging device 502.

The display apparatus 505 is formed of, for example, a panel display apparatus such as a liquid crystal panel apparatus or an organic EL (Electro Luminescence) panel apparatus and displays moving images or still images captured by the imaging device 502. The recording apparatus 506 records the moving images or still images captured by the imaging device 502 on a recording medium such as a video tape or a DVD (Digital Versatile Disk).

The operation system 507 gives an instruction of an operation on various functions of this imaging apparatus under the operation of a user. The power supply system 508 appropriately supplies various types of operating power, by which the DSP circuit 503, the frame memory 504, the display apparatus 505, the recording apparatus 506, and the operation system 507 operate, to those supply targets.

Such an imaging apparatus 500 is applied to a video camera, a digital still camera, and further a camera module for mobile devices, such as mobile phones. In the imaging apparatus 500, the imaging apparatus according to the embodiments described above can be used as the imaging device 502.

<Recording Medium>

A series of processing described above can be executed by hardware or software. In the case where the series of processing is executed by software, a program that configures the software is installed in a computer. Here, the computer includes a computer incorporated in dedicated hardware, a general-purpose personal computer that can execute various functions by installing various programs therein, and the like.

For example, in the imaging apparatus 500 shown in FIG. 20, the CPU 510 loads and executes a program recorded on the recording apparatus 506, for example, so that the series of processing described above is performed.

The program executed by a computer (CPU 510) can be provided by, for example, being recorded on a removable medium (not shown) as a package medium or the like. Further, the program can be provided via a wired or wireless transmission medium such as a local area network, the Internet, or digital satellite broadcasting.

In the imaging apparatus 500 (computer), the program can be installed in the recording apparatus 506 via the bus line 509 by mounting a removable medium to a drive (not shown). Further, the program can be received in a communication unit and installed in the recording apparatus 506 via a wired or wireless transmission medium. In addition, the program can be installed in the recording apparatus 506 in advance.

It should be noted that the program executed by the computer may be a program that is processed chronologically along the described order in this specification or may be a program that is processed in parallel or at a necessary timing such as when an invocation is performed.

Further, in this specification, a system means the overall apparatus constituted by a plurality of apparatuses.

It should be noted that the embodiments of the present technology are not limited to the above-mentioned embodiments and can be variously modified without departing from the gist of the present technology.

It should be noted that the effects described in this specification are merely exemplary ones and not restrictive ones, and any other effects may be produced.

It should be noted that the present technology can also have the following configurations.

(1) A conversion apparatus, including:
a comparison unit that compares an input voltage of an input signal and a ramp voltage of a ramp signal that varies with time; and
a storage unit that holds a code value when a comparison result from the comparison unit is inverted,
the holding of the code value by the storage unit being repeated a plurality of times, to generate a digital signal having a predetermined bit number.

(2) The conversion apparatus according to (1), in which the predetermined bit number is divided into high-order bits and low-order bits, the low-order bits are acquired earlier than the high-order bits, and the acquired low-order bits and the high-order bits are combined with each other, to generate the digital signal having the predetermined bit number.

(3) The conversion apparatus according to (2), in which the low-order bits are Gray codes.

(4) The conversion apparatus according to (2), in which at least one bit of the low-order bits and the high-order bits is shared.

(5) The conversion apparatus according to (4), in which the digital signal is corrected by a value of a bit that is one-order lower than the shared bit.

(6) The conversion apparatus according to (2), in which the ramp signal for acquiring the low-order bits and the ramp signal for acquiring the high-order bits have different cycles.

(7) The conversion apparatus according to any one of (1) to (6), in which the input signal is a signal output from a pixel and provided by each pixel.

(8) An imaging apparatus, including:
an upper substrate and a lower substrate that are laminated on each other,
the upper substrate including thereon pixels and a comparison unit that compares a voltage of a signal from the pixels and a ramp voltage of a ramp signal that varies with time,
the lower substrate including thereon a storage unit that holds a code value when a comparison result from the comparison unit is inverted,
the holding of the code value by the storage unit being repeated a plurality of times, to generate a digital signal having a predetermined bit number.

(9) The imaging apparatus according to (8), in which the predetermined bit number is divided into high-order bits and low-order bits, and the low-order bits are acquired earlier than the high-order bits,
a signal of a reference level and a signal of a signal level are acquired in an order of low-order bits of the reference level of the pixels, high-order bits of the reference level of the pixels, low-order bits of the signal level of the pixels, and high-order bits of the signal level of the pixels, and one of the signals is subtracted from the other signal, to generate a digital signal representing a charge amount accumulated in the pixels.

(10) The imaging apparatus according to (9), in which the ramp voltage when the signal of the reference level is acquired and the ramp voltage when the signal level is acquired are different from each other.

(11) The imaging apparatus according to (9), in which a change in voltage of the ramp signal when a signal on a high-intensity side of the signal level is acquired is sharper than a change in voltage of the ramp signal when a signal on a low-intensity side is acquired, or a speed at which the code value is supplied to the storage unit when the signal on the high-intensity side of the signal level is acquired is slower than a speed at which the code value is supplied to the storage unit when the signal on the low-intensity side is acquired.

(12) The imaging apparatus according to (11), in which the signal on the high-intensity side is corrected based on a difference between a signal acquired at a time point at which the change in voltage of the ramp signal is made sharp or a time point at which the speed for supply of the code value is changed, and the reference level.

(13) An electronic apparatus, including:
an imaging apparatus including
an upper substrate and a lower substrate, the upper substrate including thereon pixels and a comparison unit that compares a voltage of a signal from the pixels and a ramp voltage of a ramp signal that varies with time, the lower substrate including thereon a storage unit that holds a code value when a comparison result from the comparison unit is inverted, the holding of the code value by the storage unit being repeated a plurality of times, to generate a digital signal having a predetermined bit number; and
a signal processing unit that performs signal processing on an image signal output from the semiconductor apparatus.

(14) A conversion method for a conversion apparatus including
a comparison unit that compares an input voltage of an input signal and a ramp voltage of a ramp signal that varies with time, and
a storage unit that holds a code value when a comparison result from the comparison unit is inverted,
the conversion method including generating a digital signal having a predetermined bit number by repeating the holding of the code value by the storage unit a plurality of times.

DESCRIPTION OF SYMBOLS

10 upper substrate
11 lower substrate
21 pixel
31 ADC
51 comparator
52 latch circuit
161 latch column
221 comparison transistor
261 latch circuit
402 latch circuit

The invention claimed is:

1. An imaging apparatus, comprising:
an upper substrate including a plurality of pixel blocks; and
a lower substrate connected to the upper substrate by Cu—Cu bonding and including a plurality of A/D converters arranged in a matrix,
wherein each of the A/D converters includes a comparator and a latch circuit,
wherein the comparator is configured to compare an analog signal conveyed from one of the pixel blocks via the Cu—Cu bonding and a reference signal conveyed from a D/A Converter, and
wherein the latch circuit is configured to receive an output signal of the comparator and output a digital signal.

2. The imaging apparatus according to claim 1, wherein the reference signal is a ramp signal that varies with time.

3. The imaging apparatus according to claim 1, wherein the latch circuit is configured to hold a code value when the output signal of the comparator is inverted.

4. The imaging apparatus according to claim 1, wherein the digital signal has a predetermined bit number.

5. The imaging apparatus according to claim 4, wherein the predetermined bit number is divided into high-order bits and low-order bits.

6. The imaging apparatus according to claim 5, wherein the low-order bits are acquired earlier than the high-order bits, and the acquired low-order bits and the high-order bits are combined with each other.

7. The imaging apparatus according to claim 5, wherein the low-order bits are Gray codes.

8. The imaging apparatus according to claim 5, wherein at least one bit of the low-order bits and the high-order bits is shared.

9. The imaging apparatus according to claim 8, wherein the digital signal is corrected by a value of a bit that is one-order lower than the shared bit.

10. The imaging apparatus according to claim 5, wherein the ramp signal for acquiring the low-order bits and the ramp signal for acquiring the high-order bits have different cycles.

\* \* \* \* \*